(12) United States Patent
Cho et al.

(10) Patent No.: US 11,107,388 B2
(45) Date of Patent: Aug. 31, 2021

(54) GATE DRIVING CIRCUIT AND DISPLAY DEVICE USING THE SAME

(71) Applicant: LG Display Co., Ltd., Seoul (KR)

(72) Inventors: SungHyun Cho, Seoul (KR); ChungSik Kong, Gyeonggi-do (KR); Byoungwoo Kim, Seoul (KR); Sungwook Chang, Gyeonggi-do (KR); DongSoo Kim, Jeollabuk-do (KR)

(73) Assignee: LG Display Co., Ltd., Seoul (KR)

( * ) Notice: Subject to any disclaimer, the term of this patent is extended or adjusted under 35 U.S.C. 154(b) by 238 days.

(21) Appl. No.: 15/498,584

(22) Filed: Apr. 27, 2017

(65) Prior Publication Data

US 2017/0316731 A1 Nov. 2, 2017

(30) Foreign Application Priority Data

Apr. 29, 2016 (KR) .......................... 10-2016-0052608
Jul. 29, 2016 (KR) .......................... 10-2016-0096986

(51) Int. Cl.
*G11C 19/00* (2006.01)
*G09G 3/20* (2006.01)
*G11C 19/28* (2006.01)

(52) U.S. Cl.
CPC ........... *G09G 3/2092* (2013.01); *G11C 19/00* (2013.01); *G11C 19/28* (2013.01); *G09G 2300/0809* (2013.01); *G09G 2310/0248* (2013.01); *G09G 2310/0286* (2013.01)

(58) Field of Classification Search
None
See application file for complete search history.

(56) References Cited

U.S. PATENT DOCUMENTS

| 8,054,935 B2* | 11/2011 | Tsai | H03K 19/096 377/64 |
| 9,489,878 B2* | 11/2016 | Pai | G09G 3/20 |
| 2006/0187177 A1* | 8/2006 | Kuo | G09G 3/3677 345/100 |
| 2007/0248204 A1* | 10/2007 | Tobita | G11C 19/28 377/64 |
| 2008/0002805 A1* | 1/2008 | Tobita | G11C 19/184 377/64 |
| 2008/0101529 A1* | 5/2008 | Tobita | G09G 3/3677 377/64 |

(Continued)

*Primary Examiner* — Tuan T Lam
(74) *Attorney, Agent, or Firm* — Morgan, Lewis & Bockius LLP

(57) ABSTRACT

A gate driving circuit and a display device are disclosed. The gate driving circuit includes a shift register including a plurality of stages. Among the stages, an Nth stage includes a first transistor charging a Q node and a junction stress control circuit. A pull-up transistor using the Q node as a gate input controls an output signal of a stage output terminal. The junction stress control circuit includes a first, second, and third control transistors. The first control transistor, the second control transistor, the third control transistor, and the first transistor are connected to each other through a common node. The second control transistor adjusts junction stresses for the first control transistor and the first transistor by controlling a voltage of the common node. When the second control transistor is turned off, the third control transistor discharges the voltage of the common node.

10 Claims, 11 Drawing Sheets

(56) References Cited

U.S. PATENT DOCUMENTS

| | | | |
|---|---|---|---|
| 2008/0219401 A1* | 9/2008 | Tobita | G09G 3/3677 |
| | | | 377/79 |
| 2010/0086097 A1* | 4/2010 | Tseng | G11C 19/28 |
| | | | 377/79 |
| 2011/0140108 A1* | 6/2011 | Kimura | H01L 29/786 |
| | | | 257/57 |
| 2011/0291712 A1* | 12/2011 | Tobita | G09G 3/3677 |
| | | | 327/144 |
| 2014/0093028 A1* | 4/2014 | Wu | G11C 19/28 |
| | | | 377/64 |
| 2015/0043703 A1* | 2/2015 | Tan | G11C 19/28 |
| | | | 377/68 |
| 2016/0064098 A1* | 3/2016 | Han | G11C 19/28 |
| | | | 345/211 |
| 2016/0267854 A1* | 9/2016 | Kim | G09G 3/3466 |

* cited by examiner

GATE DRIVING CIRCUIT AND DISPLAY DEVICE USING THE SAME

CROSS-REFERENCE TO RELATED APPLICATIONS

This application claims the priority of Korean Patent Application No. 10-2016-0052608 filed on Apr. 29, 2016 and Korean Patent Application No. 10-2016-0096986 filed on Jul. 29, 2016, in the Korean Intellectual Property Office, the disclosure of which is incorporated herein by reference.

BACKGROUND

Technical Field

The present disclosure relates to a gate driving circuit and a display device using the same, for controlling a junction stress for a transistor and a display device using the same.

Description of the Related Art

As information technology has developed, the market of display devices, serving as connection media between users and information, has expanded. Various electronic devices such as a mobile phone, a tablet computer, a navigation (GPS) device, a notebook computer, a television, a monitor, and a public display (PD) have become a vital part of our daily lives. Such an electronic device is basically equipped with a display device, and the demand for the display devices have also been increasing. Examples of the display devices may include a liquid crystal display device (hereinafter, referred to as "LCD") and an organic light emitting diode display (hereinafter, referred to as "OLED").

Such a display device includes a plurality of pixels configured to display an image and a driving circuit configured to control each of the plurality of pixels to transmit light or emit light.

The driving circuit of the display device includes a data driving circuit configured to supply a data signal to data lines on a pixel array. Also, the driving circuit includes a gate driving circuit (or scan driving circuit) configured to sequentially supply a gate signal (or scan signal) in synchronization with the data signal to gate lines (or scan line) on the pixel array. Further, the driving circuit includes a timing controller configured to control the data driving circuit and the gate driving circuit.

Each of the plurality of pixels may include a thin film transistor configured to supply a voltage of a data line to a pixel electrode in response to the gate signal supplied through the gate line. The gate signal swings between a gate high voltage (VGH) and a gate low voltage (VGL). That is, the gate signal has a pulse shape signal.

The VGH is set to be higher than a threshold voltage of the thin film transistor in a display panel. The VGL is set to be lower than the threshold voltage of the thin film transistor. In case of a NMOS transistor, the thin film transistors in the pixels are turned on in response to the VGH.

In recent years, as display devices have been manufactured to be thin, a technology of embedding a gate driving circuit and a pixel array in a display panel has been developed. The gate driving circuit embedded in the display panel is known as a "gate in panel (GIP) driving circuit". Herein, the gate driving circuit includes a shift register for generating a gate signal for the pixels. The shift register includes a plurality of stages dependently connected to each other. The plurality of stages generates an output signal in response to a start signal and shifts the output signal to a subsequent stage according to a shift clock. Therefore, the gate driving circuit may generate agate signal by sequentially driving the plurality of stages in the shift register.

A typical gate driving circuit includes various transistors. Each of the transistors is configured to perform each function while charging or discharging a specific node in response to a particular signal. Signals to be input into the respective transistors may have different periods or shapes. Therefore, stresses to be applied to the respective transistors may also be different from each other. Particularly, if a high stress is applied to some transistors, a specific transistor may be degraded more rapidly than the other transistors. If an output of the specific transistor is changed accordingly, an output of the corresponding circuit may be different from what the circuit is supposed to output, which may result in a fatal defect. Therefore, it is necessary to control the speed of degradation of specific transistors included in agate driving circuit.

SUMMARY

Accordingly, embodiments of the present disclosure are directed to a gate driving circuit and display device using the same that substantially obviate one or more of the problems due to limitations and disadvantages of the related art.

An object of the present disclosure is to provide a driving circuit and a display device including the same. In the driving circuit, a junction stress for specific transistors in a gate driving circuit can be reduced by controlling a period in which a high junction stress is applied.

Another object of the present disclosure is to provide a driving circuit and a display device including the same. In the driving circuit, the stability and lifetime of a gate driving circuit can be improved using a controller that controls a junction stress.

Yet another object of the present disclosure is to provide a gate driving circuit and a display device including the same. In the gate driving circuit, the stability and lifetime can be improved by compensating for a voltage drop at a Q node which can occur when a specific transistor is degraded.

Additional features and aspects will be set forth in the description that follows, and in part will be apparent from the description, or maybe learned by practice of the inventive concepts provided herein. Other features and aspects of the inventive concepts may be realized and attained by the structure particularly pointed out in the written description, or derivable therefrom, and the claims hereof as well as the appended drawings.

According to an aspect of the present disclosure, there is provided a gate driving circuit. The gate driving circuit includes a plurality of stages. An Nth stage (N is a positive integer) of the plurality of stages includes a first transistor configured to charge a Q node and a junction stress control circuit connected to the first transistor through a common node. The junction stress control circuit may be configured to control a voltage of the common node in order to minimize a junction stress for the first transistor.

According to another aspect of the present disclosure, there is provided a display device. The display device includes a display area having a plurality of pixels, a non-display area adjacent to the display area, and a circuit unit disposed on the non-display area and corresponding to the plurality of pixels. The circuit unit includes a first transistor and a junction stress control circuit. The first transistor is configured to charge a Q node and the first transistor is connected to the junction stress control circuit through a common node. The junction stress control circuit is configured to control a drain-source voltage of the first transistor. Thus, a degradation characteristic of the first transistor can be improved as compared with a circuit without the junction stress control circuit.

According to yet another aspect of the present disclosure, there is provided a gate driver. The gate driver includes a pull-up circuit outputting an output signal to be applied to a pixel circuit that drives pixels of a display device, a first transistor controlling the pull-up circuit, and a control circuit connected to the first transistor so as to minimize degradation of the first transistor and compensate for a current leaking through the first transistor.

Details of other exemplary embodiments will be included in the detailed description of the invention and the accompanying drawings.

According to the present disclosure, a junction stress control circuit is provided, so that a junction stress for a transistor can be reduced.

According to the present disclosure, a junction stress control circuit is provided, so that the speed of degradation of a transistor can be reduced.

According to the present disclosure, a voltage of a common node is controlled, so that the speed of degradation of a transistor connected to the common node can be reduced.

According to the present disclosure, a transistor that discharges a common node is provided, so that the introduction of a ripple signal into a Q node or Nth stage output terminal can be minimized.

According to the present disclosure, a first control transistor is configured as a diode connection structure, so that the introduction of a ripple signal into a common node can be minimized.

According to the present disclosure, a transistor that charges a Q node is provided, so that the introduction of a ripple signal into a Q node can be minimized.

According to the present disclosure, a junction stress control circuit is provided, so that the speed of degradation of a transistor that charges a Q node can be reduced.

According to the present disclosure, drain-source voltages Vds of two transistors that charge a Q node are controlled, so that the two transistors are degraded at similar speeds.

According to the present disclosure, a constant voltage signal is input into a junction stress control circuit, a common node and a Q node can be rapidly charged.

According to the present disclosure, a multi-level low voltage is applied, so that the degradation of a pull-up transistor can be compensated for.

According to the present disclosure, a junction stress control circuit is provided, so that the discharge of a Q node during a bootstrap period can be minimized.

According to the present disclosure, the discharge of a Q node during a bootstrap period is minimized, so that the speed of discharge of a gate output signal can be increased and multi-output can be minimized.

According to the present disclosure, a junction stress control circuit is provided, so that the total area of a shift register can be reduced.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
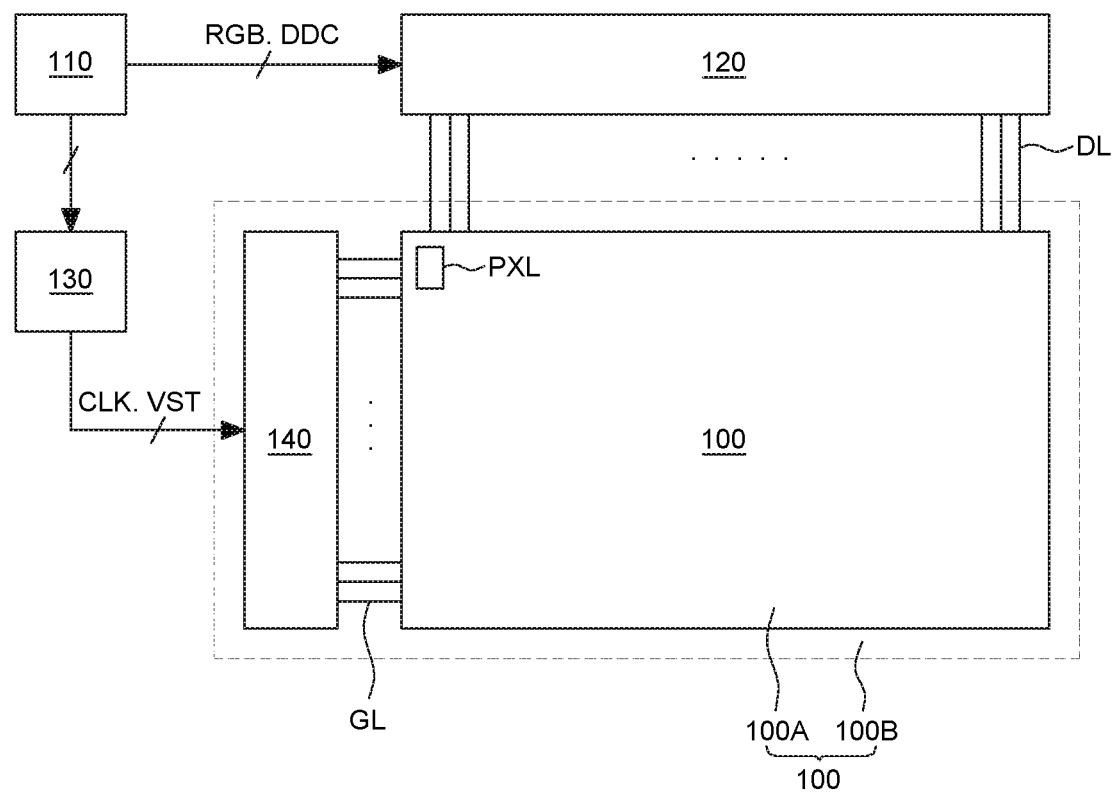
FIG. 1 is a schematic block diagram of a display device according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise. Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly". It is to be understood that when one element is referred to as being "connected to" or "coupled to" another element, it may be directly connected to or directly coupled to another element, connected to or coupled to another element, having still another element "intervening" therebetween, or "connected to" or "coupled to" another element via still another element.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Since the size and thickness of each component illustrated in the drawings are represented for convenience in explanation, the present disclosure is not necessarily limited to the illustrated size and thickness of each component.

Hereinafter, various exemplary embodiments of the present disclosure will be described in detail with reference to the accompanying drawings.

FIG. 1 is a schematic block diagram of a display device according to an exemplary embodiment of the present disclosure.

Referring to FIG. 1, a display device includes a display panel 100, a timing controller 110, a data driver 120, and scan drivers 130 and 140.

The display panel 100 includes pixels PXL divided by data lines DL and scan lines GL and connected to the data lines DL and the scan lines GL. The display panel 100 includes a display area 100A in which the pixels PXL are defined and a non-display area 100B which is positioned outside the display area 100A and in which various signal lines or pads are formed. The display panel 100 may be implemented as a display panel used in various display devices such as a liquid crystal display device (LCD), an organic light emitting diode display OLED, an electrophoretic display device (EPD), etc.

Each pixel PXL includes a transistor connected to the scan line GL or the data line DL, and a pixel circuit configured to operate in response to a scan signal and a data signal supplied by the transistor. The pixels PXL may constitute a liquid crystal display panel including a liquid crystal element or an organic light emitting display panel including an organic light emitting element.

For example, if the display panel 100 is configured as a liquid crystal display panel, the display panel 100 may be implemented in one of a twisted nematic (TN) mode, a vertical alignment (VA) mode, an in-plane switching (IPS) mode, a fringe field switching (FFS) mode, or an electrically controlled birefringence (ECB) mode. If the display panel 100 is configured as an organic light emitting display panel, the display panel 100 maybe implemented as one of a top-emission type, a bottom-emission type, or a dual-emission type.

The timing controller 110 receives a timing signal such as a vertical synchronization signal, a horizontal synchronization signal, a data enable signal, a dot clock through a receiving circuit such as an LVDS or TMDS interface connected to an image board. The timing controller 110 generates timing control signals for controlling operation timing of the data driver 120 and the scan drivers 130 and 140 on the basis of the input timing signal.

The data driver 120 includes a plurality of source driver integrated circuits (ICs). The source driver ICs are supplied with digital video data RGB and a source timing control signal DDC from the timing controller 110. The source driver ICs convert the digital video data RGB into a gamma voltage so as to generate a data voltage in response to the source timing control signal DDC. Then, the source driver ICs supply the data voltage through the data lines DL of the display panel 100. The source driver ICs are connected to the data lines DL of the display panel 100 through a Chip On Glass (COG) process or a Tape Automated Bonding (TAB) process. The source driver ICs may be formed on the display panel 100, or may be formed on a separate PCB substrate and then connected to the display panel 100.

The scan drivers 130 and 140 may include a level shifter 130 and a shift register 140. The level shifter 130 enhances voltage levels of clock signals CLK which input from the timing controller 110, and then supplies the clock signals CLK to the shift register 140. The shift register 140 may be formed as a thin film transistor (hereinafter, referred to as "TFT") in the non-display area 100B of the display panel 100 by a method of a gate-in panel (hereinafter, referred to as "GIP"). The shift register 140 includes stages configured to shift a scan signal in response to the clock signals CLK and a start signal VST and then output the scan signal. The stages included in the shift register 140 sequentially output scan signals through a plurality of output terminals.

A scan signal includes a gate high voltage VGH and a gate low voltage VGL being lower than the gate high voltage VGH. When the output terminals output the gate high voltage VGH, the scan line GL of the display panel 100 receives the gate high voltage VGH, so that a pixel emits light. After the pixel emits light, said output terminal connected to the emitting pixel outputs the gate low voltage VGL in order to suppress the introduction of a data signal. Further, while the stage output terminal is maintained at the gate low voltage VGL, it is preferable to suppress the introduction of a ripple signal.

Meanwhile, a gate driving circuit includes the shift register 140, and the shift register 140 includes a plurality of transistors. While the shift register 140 operates according to power signals and clock signals, the plurality of transistors in the shift register 140 is exposed to various stresses. A transistor are exposed to stresses not only in a period in which the transistor is turned on, but also in a period in which the transistor is turned off. Particularly, in the period in which the transistor is turned off, a junction stress may be occured due to a voltage difference between a drain electrode and a source electrode. A transistor exposed to the junction stress during a particular time may be degraded. The degraded transistor and shift register may output an unintended signal.

Hereinafter, the shift register 140 and the gate driver which the lifetime and reliability is improved by suppressing the introduction of a ripple and by improving a transistor degradation will be described with FIG. 2 through FIG. 11.

The shift register 140 includes a plurality of stages. The shift register 140 may include N number of stages (N is a positive integer) dependently connected to each other. Each of the plurality of stages generates an output signal in response to a start signal VST and transfers the output signal to a subsequent stage according to a shift clock. Therefore, the gate driving circuit may sequentially drive the plurality of stages of the shift register 140 so as to output a gate signal.

Figure 2:
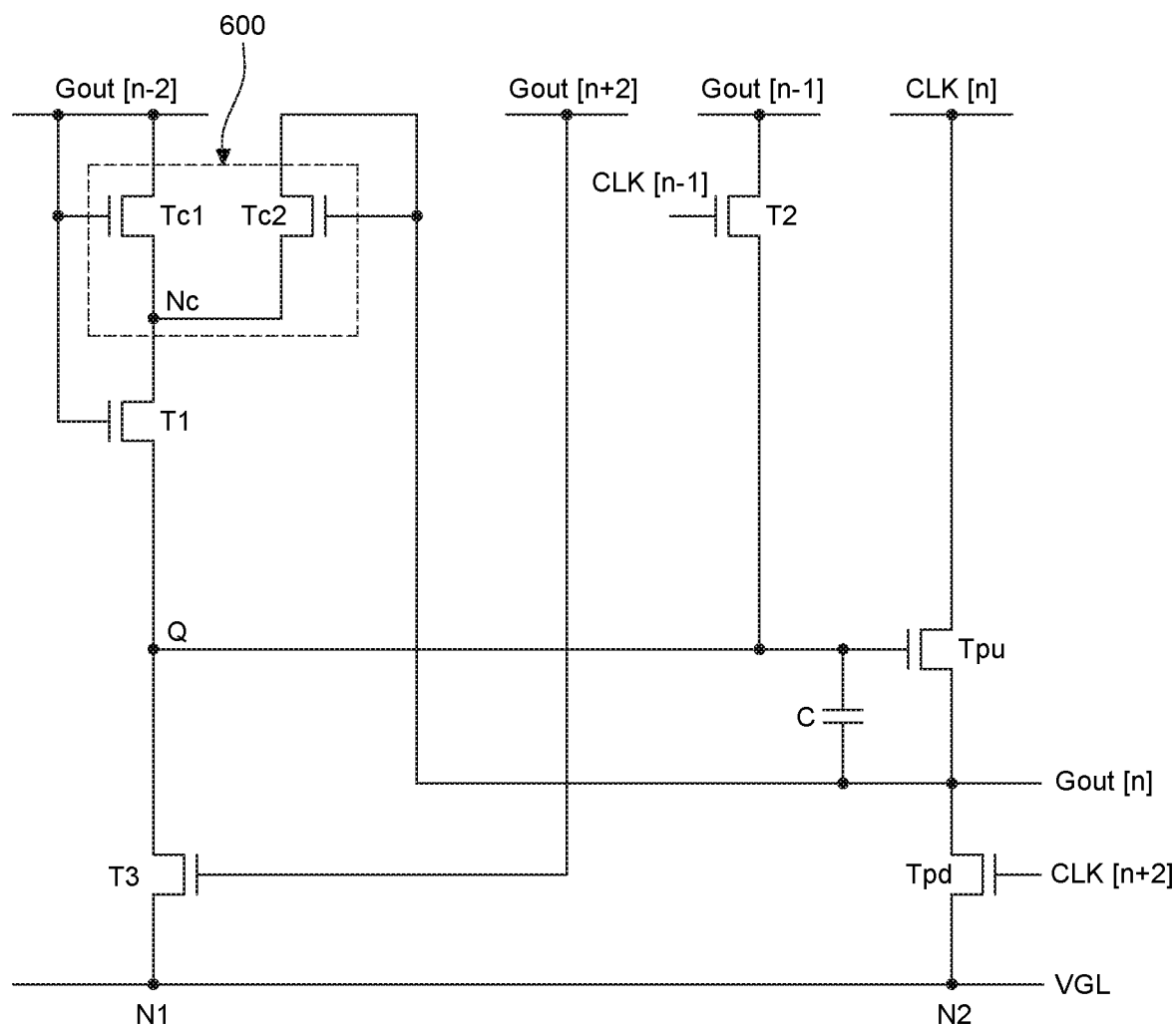
FIG. 2 is a circuit configuration diagram of an Nth stage according to an exemplary embodiment of the present disclosure.

FIG. 2 is a circuit configuration diagram of an Nth stage according to an exemplary embodiment of the present disclosure.

As illustrated in FIG. 2, an Nth stage includes a pull-up transistor Tpu, a pull-down transistor Tpd, a first transistor T1, a second transistor T2, a third transistor T3, a junction stress control circuit 600, and a capacitor C.

The functions and the configuration of the pull-up transistor Tpu, the pull-down transistor Tpd, the first transistor T1, the second transistor T2, the third transistor T3, and the capacitor C will be described below.

The pull-up transistor Tpu outputs an Nth clock signal to an Nth stage output terminal Gout[n] in response to a potential of a Q node Q. In the following description, for convenience in explanation, the Nth clock signal will be defined as a first clock signal. However, for reference, another signal (e.g., second clock signal, third clock signal, etc.) may be selected and input as the Nth clock signal depending on a position of a stage. In the pull-up transistor Tpu, a gate electrode is connected to the Q node Q, a drain electrode is connected to an Nth clock signal terminal CLK[n] that supplies a first clock signal, and a source electrode is connected to the Nth stage output terminal Gout[n].

The pull-down transistor Tpd discharges the Nth stage output terminal Gout[n] to a first low voltage terminal VGL in response to a potential of an N+ith clock signal terminal CLK[n+i]. In the following description, for convenience in explanation, an N+ith clock signal will be defined as a third clock signal. However, for reference, another signal (e.g., second clock signal, fourth clock signal, etc.) may be selected and input as the N+ith clock signal depending on a position of a stage. In the pull-down transistor Tpd, a gate electrode is connected to the N+ith clock signal terminal CLK[n+2], a source electrode is connected to the first low voltage terminal VGL, and a drain electrode is connected to the Nth stage output terminal Gout[n].

The first transistor T1 charges the Q node Q in response to the start signal VST or a potential of an N−jth stage output terminal Gout[n−j] (j is an integer of 1 or more). The first transistor T1 illustrated in FIG. 2 charges the Q node Q in response to a potential of a common node Nc. However, the common node Nc is charged to the potential of the N−jth stage output terminal Gout[n−] by a first control transistor to be described later. Therefore, it can be said that the first transistor T1 charges the Q node Q in response to the potential of the N−jth stage output terminal Gout [n−j]. In the following description, for convenience in explanation, the first transistor T1 may be operated by a potential of a virtual N−2th stage output terminal Gout [n−2] rather than the start signal VST. However, for reference, the first transistor T1 may directly receive the start signal VST or may be supplied with a signal corresponding to the start signal VST from a previous or second previous stage output terminal depending on a position of a stage. In the first transistor T1, a gate electrode is connected to the N−jth stage output terminal Gout [n−2], a source electrode is connected to the Q node Q, and a drain electrode is connected to the junction stress control circuit 600.

The second transistor T2 charges or discharges the Q node Q in response to a potential of an N−kth clock signal terminal CLK[n−k] (k is an integer of 1 or more). In the following description, for convenience in explanation, an N−kth clock signal will be defined as a fourth clock signal and an N−kth stage output terminal Gout [n−k] will be defined as an N−1th stage output terminal Gout[n−1]. However, for reference, another signal (e.g., second clock signal, third clock signal, etc.) and another stage output terminal (e.g., second output terminal, third stage output terminal, etc.) may be selected and input depending on a position of a stage. In the second transistor T2, a gate electrode is connected to the N−kth clock signal terminal CLK[n−1], a drain electrode is connected to the N−kth stage output terminal Gout [n−1], and a source electrode is connected to the Q node Q.

The third transistor T3 discharges the Q node Q to the first low voltage terminal VGL in response to a potential of an N+ith stage output terminal Gout[N+i] (i is an integer of 1 or more). In the following description, for convenience in explanation, the third transistor T3 will be described as following a potential of an N+2th stage output terminal Gout[n+2]. However, for reference, the third transistor T3 may follow a potential of a subsequent or third subsequent stage output terminal depending on a position of a stage. In the third transistor T3, a gate electrode is connected to the N+ith stage output terminal Gout[n+2], a source electrode is connected to the first low voltage terminal VGL, and a drain electrode is connected to the Q node Q.

The capacitor C bootstraps the Q node Q of the Nth stage. One electrode of the capacitor C is connected to the Q node Q and the gate electrode of the pull-up transistor Tpu and the other electrode of the capacitor C is connected to the Nth stage output terminal Gout[n].

The gate driving circuit according to an exemplary embodiment of the present disclosure includes the junction stress control circuit 600 for controlling a drain-source voltage Vds of the first transistor T1. Hereinafter, the configuration of the junction stress control circuit 600 will be described.

The junction stress control circuit 600 includes a first control transistor Tc1 and a second control transistor Tc2.

The first control transistor Tc1 is positioned between the N−jth stage output terminal Gout[n−2] and the first transistor T1. The Q node Q is charged to the potential of the N−jth stage output terminal Gout[n−2] through the first control transistor Tc1 and the first transistor T1. A gate electrode and a drain electrode of the first control transistor Tc1 may be connected to the N−jth stage output terminal Gout[n−2], and a source electrode thereof is connected to a common node Nc. The common node Nc is connected to the drain electrode of the first transistor T1.

The gate electrode of the first transistor T1 and the gate electrode of the first control transistor Tc1 may be connected in common to the N−jth stage output terminal Gout[n−2]. Therefore said configuration can allow the Q node Q to be charged with the potential of the N−jth stage output terminal Gout [n−2] during the same period.

The first control transistor Tc1 illustrated in FIG. 2 has a structure in which the gate electrode and the drain electrode are connected to each other, but is not necessarily limited thereto. For example, the gate electrode of the first control transistor Tc1 may be connected to the N−jth stage output terminal Gout[n−2] and the drain electrode of the first control transistor Tc1 may be applied with a constant voltage such as a logic high signal VGH. In this case, due to the logic high signal VGH applied to the drain electrode, a higher drain-source voltage Vds is formed in the first control transistor Tc1 than in the first control transistor Tc1 illustrated in FIG. 2. Therefore, even if a sufficient signal is not applied to the gate electrode of the first control transistor Tc1, the common node Nc can be stably charged. Further, a high drain-source voltage Vds is formed in the first transistor T1 connected to the common node Nc. Therefore, the Q node Q can be rapidly charged.

The second control transistor Tc2 is positioned between the Nth stage output terminal Gout[n] and the first transistor T1. The common node Nc is charged to a potential of the Nth stage output terminal Gout[n] through the second control transistor Tc2. A gate electrode and a drain electrode of the second control transistor Tc2 are connected to the Nth stage output terminal Gout[n], and a source electrode thereof is connected to the common node Nc.

The second control transistor Tc2 applies a voltage of a specific level to the common node Nc in synchronization with a bootstrap period BS of the Q node Q. Therefore, the drain-source voltage Vds of the first transistor T1 can be reduced in the bootstrap period BS of the Q node Q, which results in reduction of a junction stress for the first transistor T1.

A voltage of the common node Nc can be controlled such that the drain-source voltage Vds of the first transistor T1 becomes similar to the drain-source voltage Vds of the first control transistor Tc1 during the bootstrap period BS of the Q node Q. If there occurs a big difference between the drain-source voltage Vds of the first transistor T1 and the drain-source voltage Vds of the first control transistor Tc1, the first transistor T1 and the first control transistor Tc1 may receive different junction stresses respectively. Thus, the speed of degradation of the first transistor T1 may be different from the speed of degradation of the first control transistor Tc1. If any one of the first transistor T1 or the first control transistor Tc1 is degraded more rapidly than the other transistor, a signal to be transferred to the Q node Q may not be transferred enough during a particular period. In order to suppress this, the drain-source voltages Vds of the first transistor T1 and the first control transistor Tc1 may be controlled and the first transistor T1 and the first control transistor Tc1 may be controlled to be degraded at similar speeds.

A specific voltage may be applied to the common node Nc in order for the drain-source voltages Vds of the first transistor T1 and the first control transistor Tc1 to have the same value. However, under an actual circuit circumstance, the drain-source voltages Vds of the first transistor T1 and the first control transistor Tc1 may have different values. This is because the shift register 140 includes a plurality of transistors having different characteristics from each other due to various factors. For example, a voltage of the common node Nc involved in the drain-source voltages Vds of the first transistor T1 and the first control transistor Tc1 may be changed according to threshold voltages Vth of the first transistor T1 and the first control transistor Tc1. Also, a bootstrap voltage of the Q node Q involved in the drain-source voltages Vds of the first transistor T1 and the first control transistor Tc1 may be changed according to a pre-charging voltage of the Q node Q. Further, the drain-source voltages Vds of the first transistor T1 and the first control transistor Tc1 included in the shift register 140 maybe different from each other due to various characteristics of a material of transistors.

The second control transistor Tc2 may control the voltage of the common node Nc such that the drain-source voltages Vds of the first transistor T1 and the first control transistor Tc1 have a specific range respectively. For example, the second control transistor Tc2 may control the voltage of the common node Nc such that a ratio of the drain-source voltage Vds of the first transistor T1 to the drain-source voltage Vds of the first control transistor Tc1 can be 1:0.9 or more. If the drain-source voltage Vds of the first control transistor Tc1 is 30 V, the voltage of the common node Nc may be controlled such that the drain-source voltage Vds of the first transistor T1 can be in the range of 27 V to 30 V.

Meanwhile, the second control transistor Tc2 may control the voltage of the common node Nc such that the drain-source voltage Vds of the first control transistor Tc1 and the drain-source voltage Vds of the first transistor T1 have different values each other. For example, if the first control transistor Tc1 is designed to be strong against to a junction stress, the first control transistor Tc1 may be applied with a higher drain-source voltage Vds than the first transistor T1. That is, the speed of degradation of the overall shift register 140 can be reduced by controlling a junction stress.

The gate electrode and the drain electrode in each of the first control transistor Tc1 and the second control transistor Tc2 may be connected to each other. If a ripple signal is introduced to the gate electrode of the second control transistor Tc2, the second control transistor Tc2 in which the gate electrode and the drain electrode are connected to each other may have a lower drain-source voltage Vds than a control transistor in which gate electrode and the drain electrode are not connected to each other. Specifically, for example, it is assumed that a gate electrode and a drain electrode are electrically connected to each other in a transistor A and a gate electrode and a drain electrode are not electrically connected to each other in a transistor B. Also, it is assumed that a voltage of −10 V is applied in common to source electrodes of the transistor A and the transistor B and a voltage of 10 V is applied to the drain electrode of the transistor B which is not connected to the gate electrode. In this case, if a ripple signal having a voltage of −5 V is introduced to the respective gate electrodes of the transistor A and the transistor B, gate-source voltages Vgs of the transistor A and the transistor B have the same value of 5 V. However, a drain-source voltage Vds of the transistor A is 5 V, whereas a drain-source voltage Vds of the transistor B is 20 V. Therefore, the drain-source voltage Vds of the transistor B in which the gate electrode and the drain electrode are not connected to each other has a higher value. In a general transistor in which a gate-source voltage Vgs is equal to a threshold voltage Vth, as a drain-source voltage Vds is decreased, the speed of a signal moving from a drain electrode to a source electrode is decreased. Therefore, in the transistor B in which the gate electrode and the drain electrode are not connected to each other, the ripple signal introduced to the gate electrode can move to the source electrode at a relatively high speed as compared with the transistor A. Therefore, as illustrated in FIG. 2, the structure of each of the first control transistor Tc1 and the second control transistor Tc2 in which the gate electrode and the drain electrode are connected to each other can minimize the introduction of a ripple signal. However, the present disclosure is not necessarily limited to the structure in which the gate electrode and the drain electrode are connected to each other.

Figure 3:
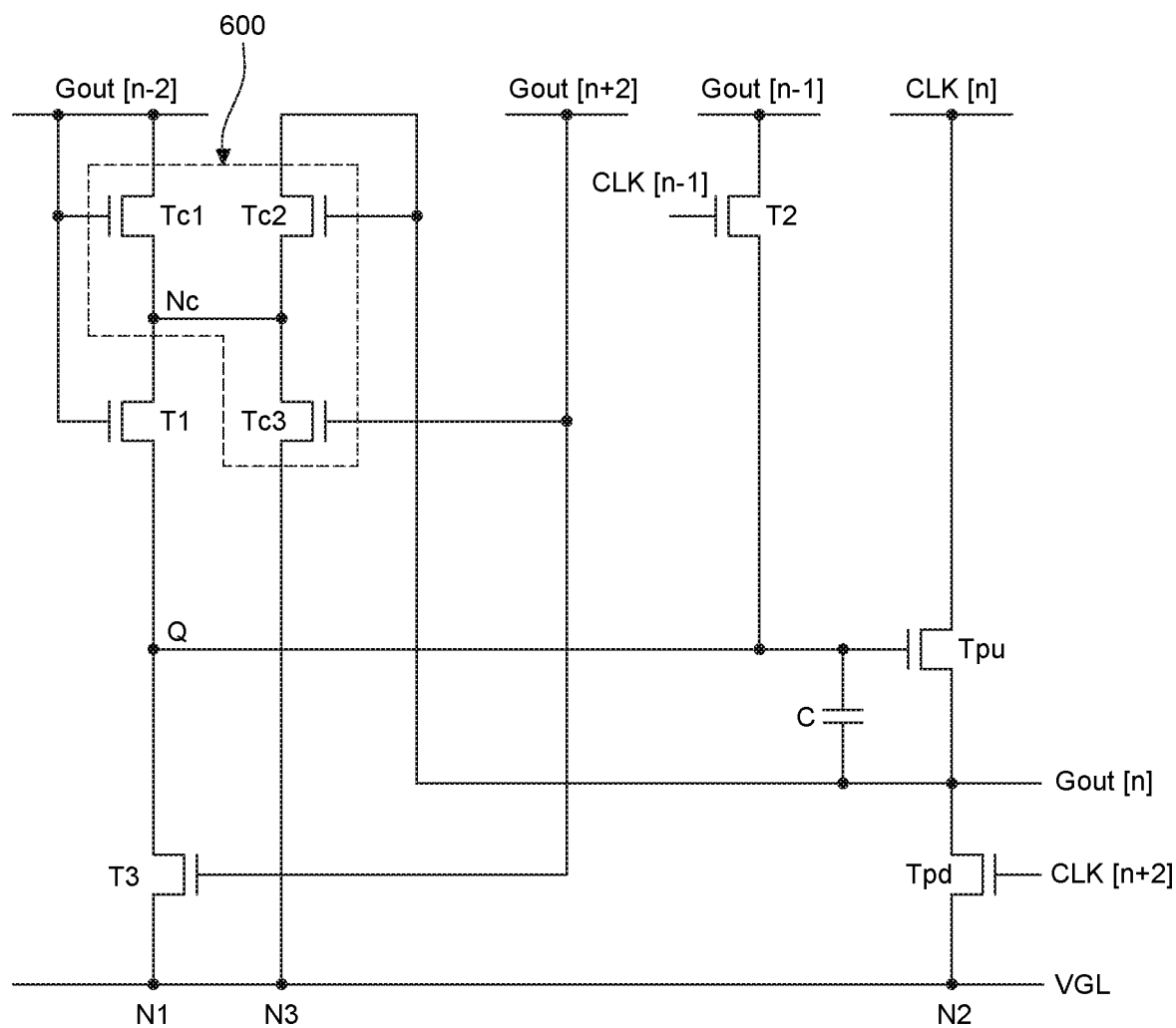
FIG. 3 is a circuit configuration diagram of an Nth stage according to an exemplary embodiment of the present disclosure.

FIG. 3 is a circuit configuration diagram of an Nth stage according to an exemplary embodiment of the present disclosure.

The junction stress control circuit 600 may further include a third control transistor Tc3. The third control transistor Tc3 functions to discharge the common node Nc when an output of the Nth stage is changed from a logic high signal VGH to a logic low signal VGL, i.e., right after the second control transistor Tc2 is turned off. In the third control transistor Tc3, a gate electrode is connected to the N+ith stage output terminal Gout [n+2], a source electrode is connected to the first low voltage terminal VGL, and a drain electrode is connected to the common node Nc.

The third control transistor Tc3 allows the common node Nc to be discharged during an intended time. During a period in which the output of the Nth stage needs to be maintained in a logic low state, an unintended ripple signal maybe introduced into a terminal of the gate electrode of the first transistor T1. Due to the ripple signal, the first transistor T1 may be temporarily turned on. Therefore, the ripple signal may be transferred into the Q node Q through the first control transistor Tc1 and the first transistor T1, or a potential of the common node Nc may be charged by the Q node Q. Thus, the pull-up transistor Tpu may be turned on, and, thus, a potential of the Nth clock signal terminal CLK[n] may be transferred to the Nth stage output terminal Gout[n]. If the potential of the Nth clock signal terminal CLK[n] is in a logic high state when the pull-up transistor Tpu is turned on in response to the ripple signal, the logic high signal VGH may be transferred into the Nth stage output terminal Gout[n]. Accordingly, the junction stress control circuit 600 includes the third control transistor Tc3, and thus, can suppress the introduction of an unintended ripple signal into the Nth stage output terminal Gout [n] in advance.

Figure 4:
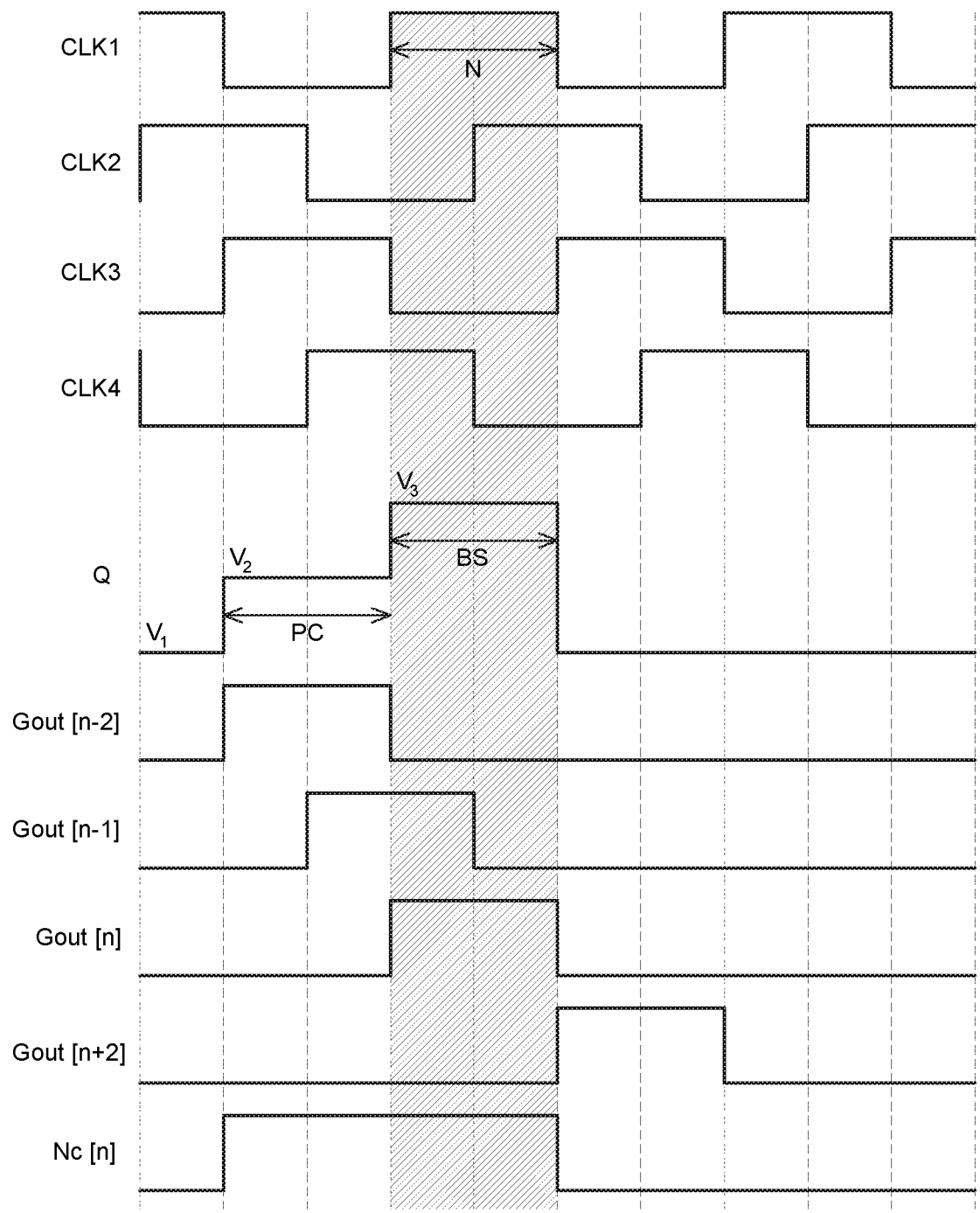
FIG. 4 is a schematic timing chart of the circuit illustrated in FIG. 3.

FIG. 4 is a schematic timing chart of the circuit illustrated in FIG. 3.

The operation characteristics of the Nth stage will be described in detail with reference to FIG. 3 and FIG. 4. However, positions and widths of waveforms illustrated in FIG. 4 are one of examples, but the present disclosure is not limited thereto.

According to a system of four-phase clock signals CLK1 to CLK4, first to fourth clock signals CLK1 to CLK4 are formed to be sequentially converted from a logic high state into a logic low state. In this case, the first clock signal CLK1 and the second clock signal CLK2 are formed to have an overlapped period, the second clock signal CLK2 and the third clock signal CLK3 are formed to have an overlapped period, and the third clock signal CLK3 and the fourth clock signal CLK4 are formed to have an overlapped period. The four-phase clock signals CLK1 to CLK4 may be formed to have about ½ overlapped periods, but are not necessarily limited thereto. Further, in the present exemplary embodiment, the four-phase clock signals are used, but the present disclosure is not necessarily limited thereto.

The Nth stage charges the Q node Q in response to a potential of the N−jth stage output terminal Gout[n−2] and discharges the Q node Q in response to a potential of the N+ith stage output terminal Gout[n+2].

A pre-charging period PC and a bootstrap period BS refer to periods in which the Q node Q is charged to a voltage higher than a first potential $V_1$ described in FIG. 4. During the pre-charging period PC and the bootstrap period BS of the Q node Q, a signal of the Nth clock signal terminal CLK[n] may be output through the Nth stage output terminal Gout[n]. Further, during a period in which the Q node Q is maintained at the first potential $V_1$, the Nth stage output terminal Gout[n] outputs a signal of the first low voltage terminal VGL. Details thereof will be described below.

During the pre-charging period PC, the first transistor T1 and the first control transistor Tc1 are turned on in response to the potential of the N−jth stage output terminal Gout[n−2] and the Q node Q is charged accordingly. The pull-up transistor Tpu is turned on by a potential of the charged Q node Q, and an Nth scan signal corresponding to the Nth clock signal CLK1 is output through the Nth stage output terminal Gout[n]. During the pre-charging period PC, the Nth clock signal CLK1 maintains in a logic low state.

Therefore the Nth stage output terminal Gout[n] outputs a logic low signal VGL. Then, if the Nth clock signal CLK1 is changed to a logic high state during the bootstrap period BS, the Nth stage output terminal Gout [n] outputs a logic high signal VGH of the Nth clock signal CLK1.

A change in potential during the bootstrap period BS of the Q node Q can be explained in association with the conservation law of electrical charge. In the bootstrap period BS of the Q node Q, an equation $C (\Delta V_a - \Delta V_b) = C_{TFT} (\Delta V_b - \Delta V_c)$ can be satisfied. Herein, C is a capacitance of a capacitor C, $\Delta V_a$ is a potential variation of the Q node Q, $\Delta V_b$ is a potential variation of the Nth stage output terminal Gout[n], $C_{TFT}$ is a parasitic capacitance of the pull-up transistor Tpu, and $\Delta V_c$ is a potential variation of the Nth clock signal. In the bootstrap period BS of the Q node Q, $\Delta V_b$ and $\Delta V_c$ have a difference value of 0. Therefore, $\Delta V_b$ and $\Delta V_c$ have the same value. Accordingly, in the bootstrap period BS of the Q node Q, Q[N] is increased in level from a second potential $V_2$ to a third potential $V_3$ higher than the second potential $V_2$ as illustrated in FIG. 4.

The pull-up transistor Tpu transfers a signal applied to the drain electrode to the source electrode while the pull-up transistor Tpu is turned on. In this case, a transistor is turned on only when a gate-source voltage Vgs of the transistor is higher than a threshold voltage Vth of the transistor. If the Q node Q is maintained at the second potential $V_2$ without bootstrapping, there may occur a period in which the gate-source voltage Vgs is lower than the threshold voltage Vth. If the Q node Q is maintained at the third potential $V_3$ higher than the second potential $V_2$ after bootstrapping, a period in which the gate-source voltage Vgs is higher than the threshold voltage Vth can last more longer than the case where the Q node Q is not bootstrapped. Therefore, the pull-up transistor Tpu can be turned on for a enough time. Accordingly, the pull-up transistor Tpu can more effectively transfer a signal applied to the drain electrode to the source electrode in the case where the Q node Q is maintained at the third potential $V_3$ than in the case where the Q node Q is maintained at the second potential $V_2$. Even if the pull-up transistor Tpu is degraded, the gate electrode of the pull-up transistor Tpu is applied with the third potential $V_3$ higher than the second potential $V_2$. Thus, it can be turned on for a longer time than a pull-up transistor which is not bootstrapped to the third potential $V_3$. Therefore, the degradation of the pull-up transistor Tpu can be compensated for through the bootstrap period BS of the Q node Q.

The bootstrap period BS of the Q node Q may be more effective in an NMOS transistor. The NMOS transistor is turned off during a period in which a gate-source voltage Vgs is lower than a threshold voltage Vth. Therefore, time may be not enough to sufficiently charge a source electrode. If the bootstrap period is applied thereto, the gate-source voltage Vgs can maintain a higher value than the threshold voltage Vth and the transistor is not turned off. Therefore, time may be enough to transfer a signal applied to a drain electrode to the source electrode. Thus, the pull-up transistor Tpu of FIG. 3 and FIG. 4 in which the bootstrapped Q node Q and the gate electrode are connected to each other may be an NMOS transistor. A semiconductor layer of the NMOS transistor maybe formed of oxide. The oxide maybe anyone of a-IGZO, a-ITZO, IZO, ZnO, IGO, or IAZO, but is not necessarily limited thereto.

When the bootstrap period BS of the Q node Q is ended, the pull-down transistor Tpd is turned on in response to a logic high signal VGH of the N+ith clock signal CLK3 and its output terminal, i.e., the Nth stage output terminal Gout[n], is discharged. Also, the Q node Q is discharged by the third transistor T3 in response to the potential of the N+ith stage output terminal Gout[n+2]. A potential of the Q node Q is periodically discharged to the N-kth stage output terminal Gout [n-1] by the second transistor T2 which is turned on in response to the N-kth clock signal terminal CLK[n-1]. Therefore, the Nth stage output terminal Gout[n] maintains the first potential $V_1$ of the first low voltage terminal VGL.

A waveform of the common node Nc will be described with reference to FIG. 3 and FIG. 4.

While a signal of the N-jth stage output terminal Gout [n-2] is maintained in a logic high state, the first control transistor Tc1 is turned on and the common node Nc is maintained in a logic high state. Then, if the Nth stage output terminal Gout[n] is in a logic high state, the common node Nc is maintained in a logic high state by the second control transistor Tc2. Then, when a signal of the N+ith stage output terminal Gout[n+2] is in a logic high state, the common node Nc is discharged and then maintained in a logic low state by a third control transistor Tc3.

The Q node Q is maintained in a logic low state except during the pre-charging period PC and the bootstrap period BS. However, the Q node Q may be coupled to a rising edge of a signal of the Nth clock signal terminal CLK[n], so that a ripple signal may be introduced to the Q node Q. The second transistor T2 can suppress the introduction of a ripple signal.

The second transistor T2 is turned on in response to the N-kth clock signal terminal CLK[n-1]. A period in which the second transistor T2 is turned on can be classified into two cases.

In a first case, while the N-kth clock signal terminal CLK[n-1] is maintained in a logic high state, the N-kth stage output terminal Gout [n-1] is maintained in a logic low state. During this period, the Nth stage output terminal Gout [n] needs to be maintained at the logic low signal VGL. During this period, the second transistor T2 may discharge a ripple signal introduced to the Q node Q to the N-kth stage output terminal Gout[n-1].

In a second case, while the N-kth clock signal terminal CLK[n-1] is maintained in a logic high state, the N-kth stage output terminal Gout [n-1] is maintained in a logic high state. During this period, the Q node Q needs to be maintained at the second potential $V_2$ or more. During this period, the second transistor T2 transfers a logic high signal VGH of the N-kth stage output terminal Gout [n-1] to the Q node and thus suppresses a decrease in potential of the Q node Q to be lower than the second potential $V_2$.

Referring to FIG. 2 and FIG. 3, the gate electrodes of the first control transistor Tc1 and the first transistor T1 are connected to the N-2th stage output terminal Gout[n-2]. However, the present disclosure is not necessarily limited thereto. For example, the gate electrodes of the first control transistor Tc1 and the first transistor T1 may be connected to the N-1th stage output terminal Gout [n-1]. In this case, a pre-charging period PC may be shorter as compared with the case where the gate electrodes are connected to the N-2th stage output terminal Gout [n-2]. As such, a length of the pre-charging period PC of the Q node Q can be adjusted depending on various circuit configurations.

Referring to FIG. 3 and FIG. 4, during the bootstrap period BS of the Q node Q, the first control transistor Tc1 and the first transistor T1 are turned off in response to a logic low signal VGL of the N-jth stage output terminal Gout[n-2]. In this case, the drain-source voltage Vds of the first control transistor Tc1 and the drain-source voltage Vds of the first transistor T1 serve as junction stresses for the respective transistors.

During the bootstrap period BS of the Q node Q, the second control transistor Tc2 is turned on to charge the common node Nc with a voltage having a lower potential than the voltage of the Q node Q. Thus, the drain-source voltage Vds of the first control transistor Tc1 and the drain-source voltage Vds of the first transistor T1 are decreased as compared with the case where the junction stress control circuit 600 is not provided. Therefore, junction stresses to be applied to the first control transistor Tc1 and the first transistor T1 are decreased, so that the speed of degradation is reduced, thereby minimizing degradation.

Figure 5A:
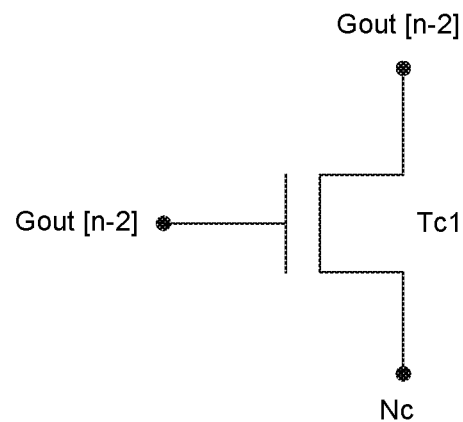
FIG. 5A illustrates the first control transistor illustrated in FIG. 3.
Figure 6A:
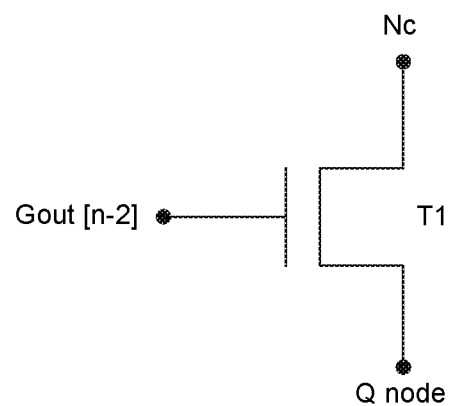
FIG. 6A illustrates the first transistor illustrated in FIG. 3.

FIG. 5A illustrates the first control transistor Tc1 illustrated in FIG. 3, and FIG. 6A illustrates the first transistor T1 illustrated in FIG. 3.

The gate electrode and the drain electrode of the first control transistor Tc1 are connected to the N-jth stage output terminal Gout[n-2] and the source electrode thereof is connected to the common node Nc. The gate electrode of the first transistor T1 is connected to the N-jth stage output terminal Gout[n-2], the drain electrode thereof is connected to the common node Nc, and the source electrode is connected to the Q node Q.

Figure 5B:
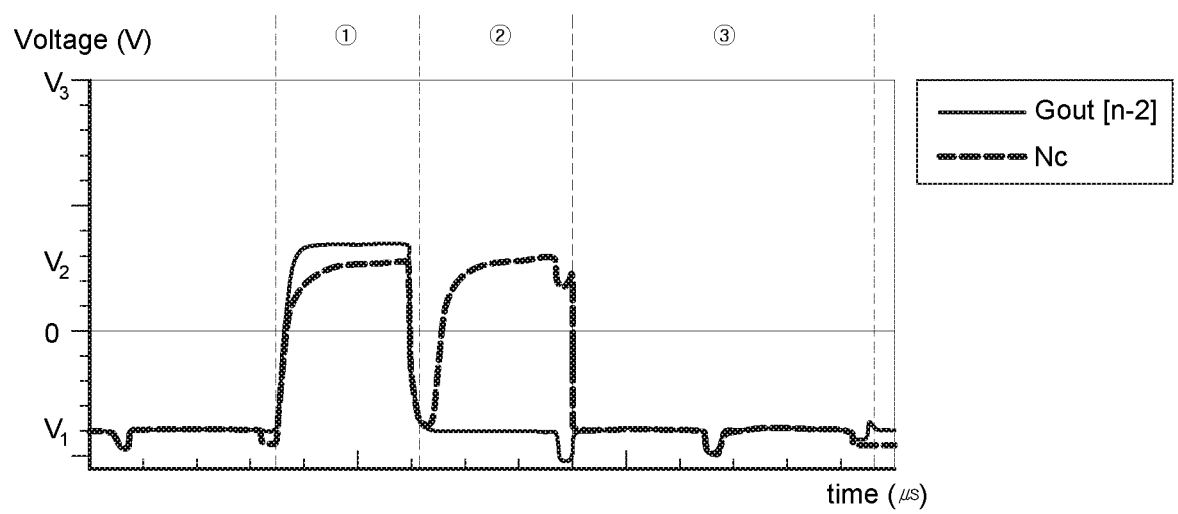
FIG. 5B is a graph showing waveforms in a drain electrode and a source electrode of the first control transistor illustrated in FIG. 3.
Figure 6B:
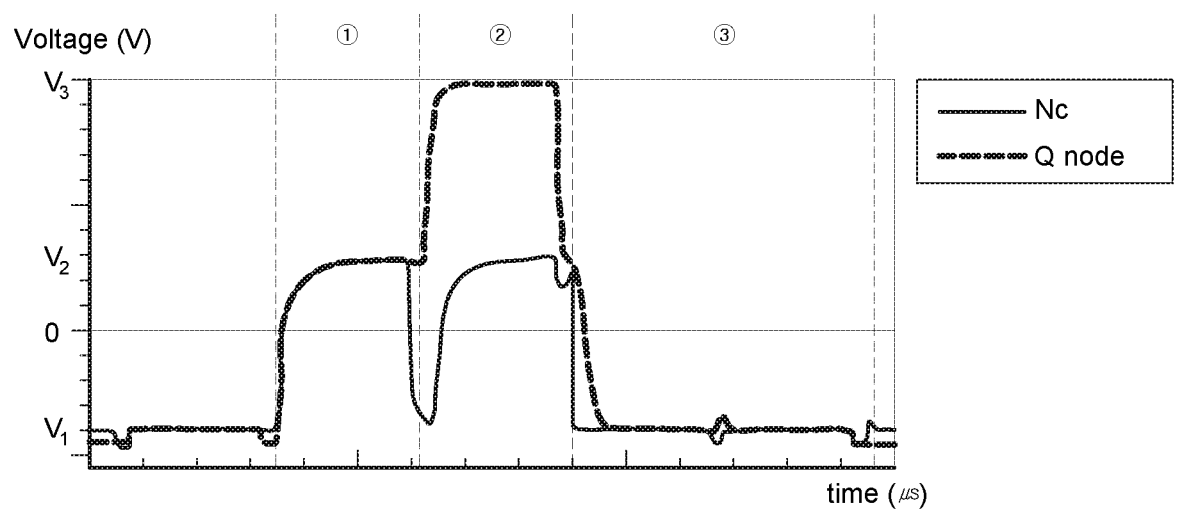
FIG. 6B is a graph showing waveforms in a drain electrode and a source electrode of the first transistor illustrated in FIG. 3.

FIG. 5B is a graph showing waveforms in a drain electrode and a source electrode of the first control transistor Tc1 illustrated in FIG. 3. FIG. 6B is a graph showing waveforms in a drain electrode and a source electrode of the first transistor T1 illustrated in FIG. 3.

A change in the waveform of the Q node Q will be described in detail with reference to FIG. 6B. A first period ① is the pre-charging period PC of the Q node Q. During the first period ①, the Q node Q is maintained at the second potential $V_2$. A second period ② is the bootstrap period BS of the Q node Q. During the second period ②, the Q node is maintained at the third potential $V_3$. A third period ③ is a discharge period of the Q node Q. During the third period ③, the Q node Q is maintained at the first potential $V_1$.

During the first period ① and the second period ②, the Q node Q is charged to the second potential $V_2$ or the third potential $V_3$. Therefore, the pull-up transistor Tpu is turned on so as to transfer a voltage of the Nth clock signal terminal CLK1 as a logic high signal VGH to its output terminal, i.e., the Nth stage output terminal Gout[n].

Referring to FIG. 5B and FIG. 6B, a change in drain-source voltage Vds of the first control transistor Tc1 and the first transistor T1 depending on time can be seen. A drain-source voltage Vds is a difference between a voltage of a drain electrode and a voltage of a source electrode. During the first period ① and the during the third period ③, there is a small difference between the drain-source voltage Vds of the first control transistor Tc1 and the drain-source voltage Vds of the first transistor T1. However, during the second period ②, a difference between the drain-source voltage Vds of the first control transistor Tc1 and the drain-source voltage Vds of the first transistor T1 is approximately equal to a peak voltage Vpp. Herein, the peak voltage Vpp is defined as a difference between a voltage of the first potential $V_1$ and a voltage of the second potential $V_2$. A difference between the voltage of the second potential $V_2$ and a voltage of the third potential $V_3$ is also approximately equal to the peak voltage Vpp. During the entire period, the maximum difference between the drain-source voltage Vds of the first control transistor Tc1 and the drain-source voltage Vds of the first transistor T1 is approximately equal to the peak voltage Vpp.

Figure 7A:
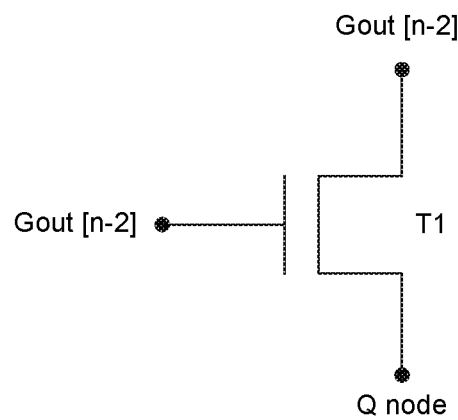
FIG. 7A illustrates a first transistor according to Comparative Example.

FIG. 7A illustrates a first transistor T1 according to a Comparative Example. Specifically, FIG. 7A illustrates a first transistor T1 of the shift register 140 to which the junction stress control circuit 600 is not applied. In this case, a gate electrode and a drain electrode of the first transistor T1 are connected to the N−jth stage output terminal Gout [n−2] and a source electrode thereof is connected to the Q node Q.

Figure 7B:
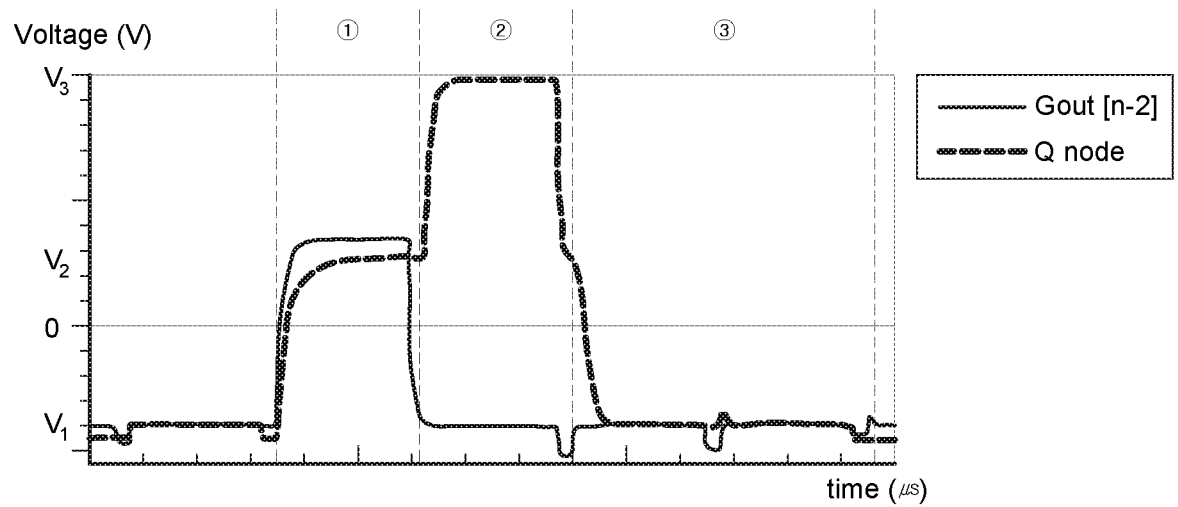
FIG. 7B is a graph showing waveforms in a drain electrode and a source electrode of the first transistor illustrated in FIG. 7A.

FIG. 7B is a graph showing waveforms in a drain electrode and a source electrode of the first transistor T1 illustrated in FIG. 7A. During the second period ②, a voltage of the drain electrode is maintained at the first potential $V_1$ and a voltage of the source electrode is maintained at the third potential $V_3$. Therefore, during the second period ②, a drain-source voltage Vds equal to about two times the peak voltage Vpp is formed in the first transistor T1.

As such, it can be seen that the first transistors T1 according to the Comparative Example and the exemplary embodiment have a great difference in drain-source voltage Vds. More specifically, during the bootstrap period BS of the Q node Q, i.e., the second period ②, there is about two times difference in drain-source voltage Vds of the first transistor T1 depending on absence or presence of the junction stress control circuit 600. Also, it can be seen that the junction stress control circuit 600 allows the first transistor T1 to reduce a junction stress.

Referring to FIG. 5B, during the bootstrap period BS of the Q node Q, i.e., the second period ②, a drain-source voltage Vds approximately equal to the peak voltage Vpp is formed in the first control transistor Tc1. It can be seen that the drain-source voltage Vds of the first control transistor Tc1 illustrated in FIG. 5A is decreased as compared with that of the first transistor T1 illustrated in FIG. 7A.

The second period ② refers to a period in which the first transistor T1 is applied with a higher junction stress than the other transistors. However, in case of the shift register circuit 140 according to the Example of the present disclosure, which includes the junction stress control circuit 600, the drain-source voltage Vds of the first transistor T1 can be controlled to be the peak voltage Vpp.

Figure 8:
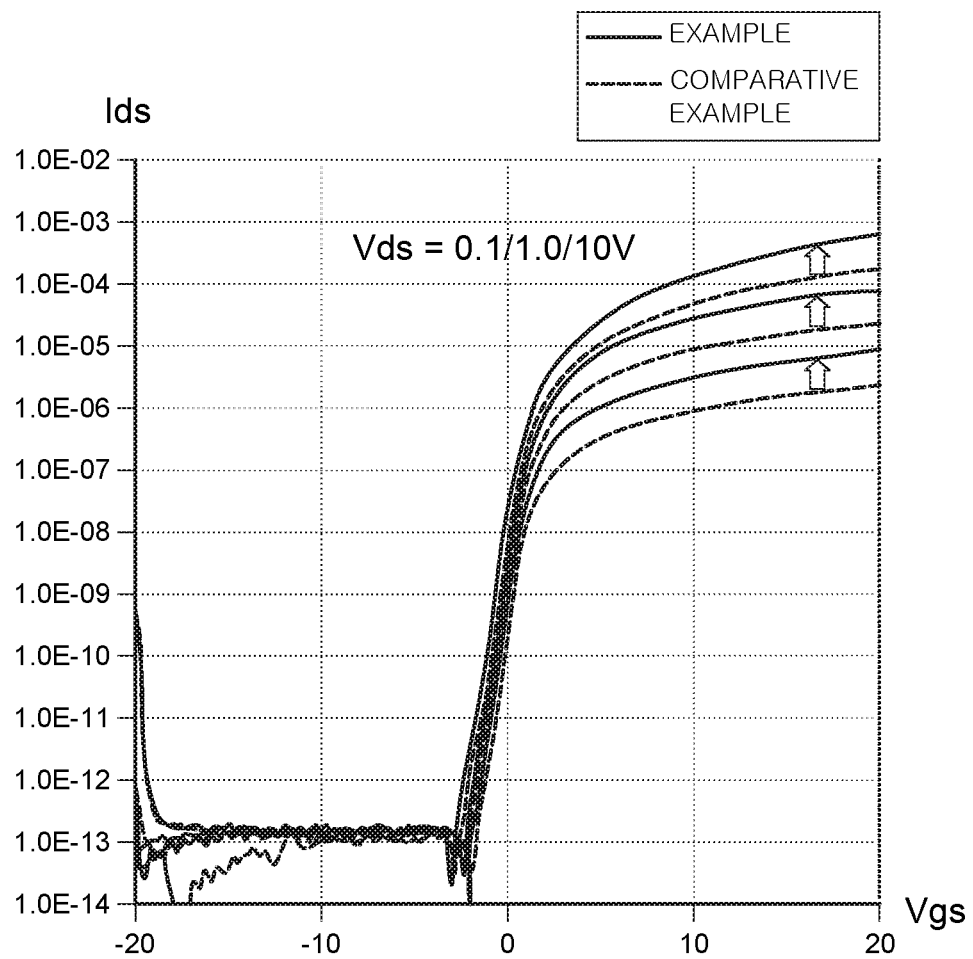
FIG. 8 shows I-V curves of the first transistor according to Example of the present disclosure and the first transistor according to Comparative Example.

FIG. 8 shows I-V curves of the first transistor T1 according to the Example of the present disclosure and the first transistor T1 according to the Comparative Example. Specifically, FIG. 8 shows I-V curves of the first transistor T1 according to the Example of the present disclosure and the first transistor T1 according to the Comparative Example measured under severe conditions. In FIG. 8, the first transistor T1 illustrated in FIG. 6A and the first transistor T1 illustrated in FIG. 7A are compared. Referring to the I-V curves illustrated in FIG. 8, degradation characteristics of the first transistors T1 during the bootstrap period BS of the Q node Q can be seen. Herein, the degradation characteristics refer to deterioration in performance of a transistor caused by a change in output characteristics of the transistor when the transistor is exposed to a stress such as a junction stress for a long time.

A solid line indicates the first transistor T1 illustrated in FIG. 6A and a dotted line indicates the first transistor T1 illustrated in FIG. 7A. While the two kinds of first transistors T1 were exposed at 60° C. for 10 minutes under the conditions similar to those of the bootstrap period BS, I-V curves thereof were measured.

Referring to FIG. 8, it can be seen that the transistor indicated by the solid line is improved in degradation characteristics as compared with the transistor indicated by the dotted line. In the first transistor T1 illustrated in FIG. 7A without the junction stress control circuit 600, an on-current (hereinafter, referred to as "Ion") was degraded after a particular time. However, the first transistor T1 illustrated in FIG. 6A and including the junction stress control circuit 600 shows characteristics similar to transistors before the exposure to a high temperature. The on-current (Ion) refers to a current flowing through an active layer of a transistor during a period in which the transistor is turned on. The degradation of the Ion refers to a decrease in amount of current flowing through the active layer of the transistor after a particular time.

The inventors of the present disclosure recognized that Ion is degraded due to a junction stress, and invented a circuit for adjusting a junction stress for a transistor and a display device including the circuit in order to improve the degradation. Also, the inventors of the present disclosure invented the shift register 140 improved in lifetime and reliability by minimizing the introduction of a ripple signal to an output of a stage and a display device including the shift register 140.

The configuration in which the junction stress control circuit 600 reduces a junction stress for the first transistor T1 has been described above. However, configuration of the junction stress control circuit 600 is not limited to the first transistor T1 illustrated in FIG. 2 or FIG. 3. For example, the shift register 140 may be configured by applying the junction stress control circuit 600 to another transistor connected to the Q node Q.

Figure 9:
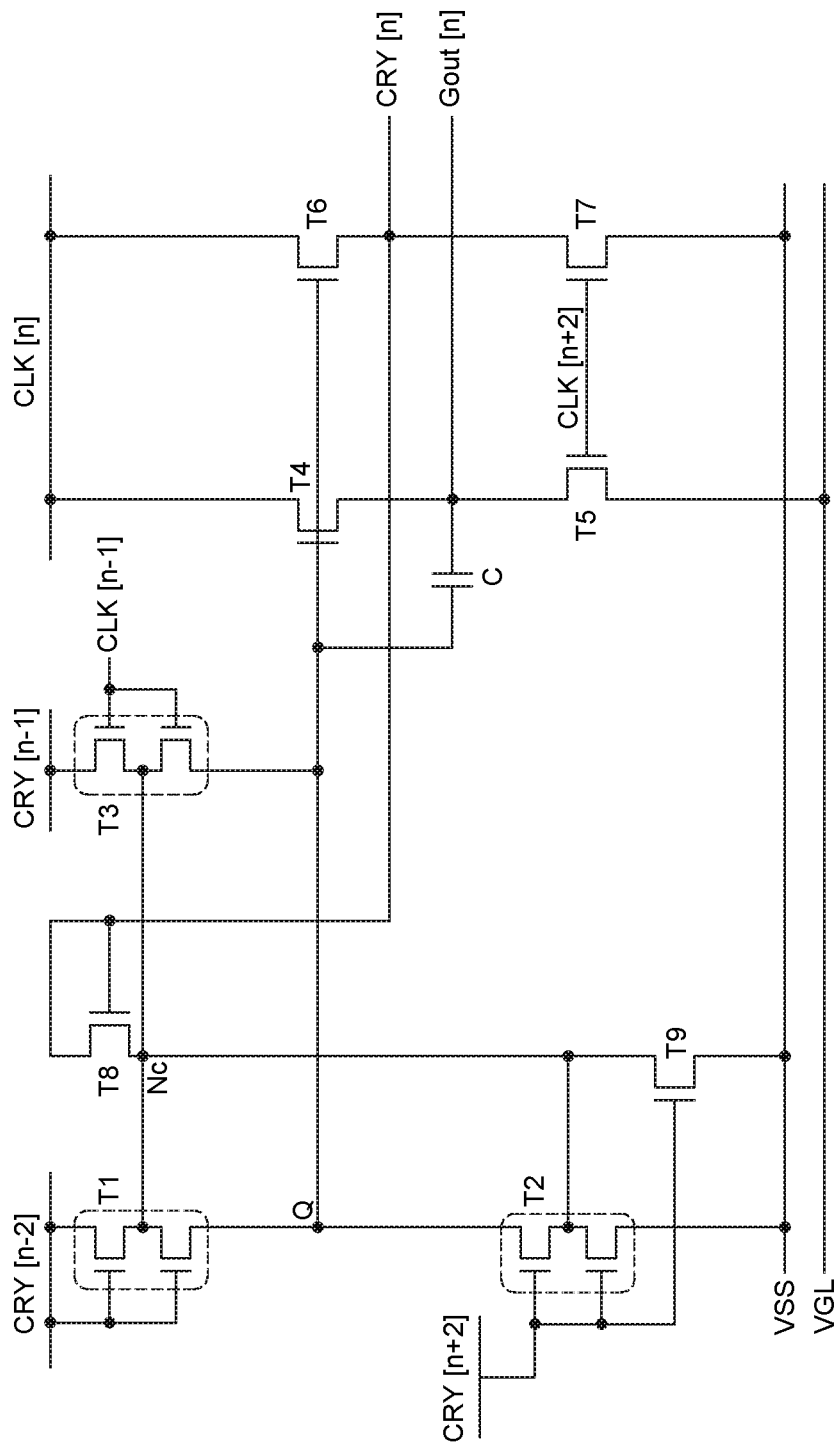
FIG. 9 is a circuit configuration diagram of an Nth stage according to an exemplary embodiment of the present disclosure.
Figure 10:
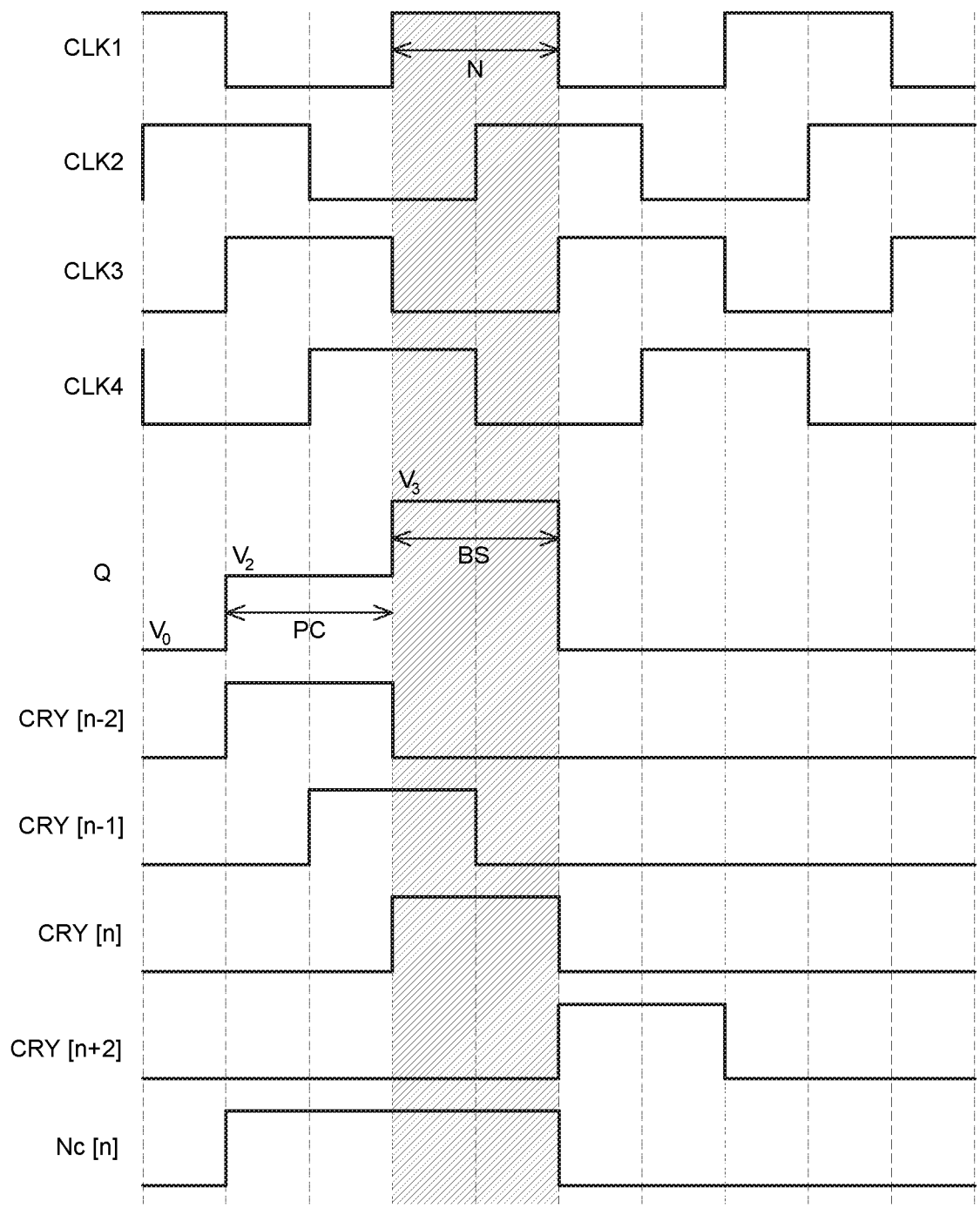
FIG. 10 is a schematic timing chart of the circuit illustrated in FIG. 9.

FIG. 9 is a circuit configuration diagram of an Nth stage according to an exemplary embodiment of the present disclosure, and FIG. 10 is a schematic timing chart of the circuit illustrated in FIG. 9.

A configuration and operation characteristics of the Nth stage according to the exemplary embodiment of the present disclosure will be described with reference to FIG. 9 and FIG. 10.

The shift register 140 illustrated in FIG. 9 may employ a multi-level low voltage terminal. In addition to the first low voltage terminal VGL illustrated in FIG. 2 or FIG. 3, the shift register 140 may further include a low voltage terminal having a different potential level from the first low voltage terminal VGL. The shift register 140 illustrated in FIG. 9 uses a second low voltage terminal VSS having a lower potential level than the first low voltage terminal VGL. Herein, the lower potential level refers to a potential level having a higher absolute potential value when the potential level is lower than 0. Also, the lower potential level refers to a potential level having a lower absolute potential value when the potential level is higher than 0. For example, if the first low voltage terminal VGL has a voltage of −12 V, a voltage of the second low voltage terminal VSS may be −15 V which is lower than −12 V. Further, if the first low voltage terminal VGL has a voltage of 5 V, a voltage of the second low voltage terminal VSS may be 3 V which is lower than 5 V. The multi-level low voltage terminal can also be applied to the shift register 140 illustrated in FIG. 2 and FIG. 3.

An output signal of the Nth stage may include two kinds of signals to be output through the Nth stage output terminal Gout [n] and an Nth stage carry terminal CRY[n]. These two signals may be the same each other, but maybe different from each other in actually measured waveform. The Nth stage output terminal Gout[n] is connected to a pixel PXL of the display panel 100. The Nth stage carry terminal CRY[n] is not connected to the pixel PXL of the display panel 100 and connected to the shift register circuit 140. Therefore, a signal of the Nth stage output terminal Gout[n] connected to the pixel PXL having a high load may be distorted in waveform due to an RC delay. Meanwhile, a signal of the Nth stage carry terminal CRY[n] connected to the shift register circuit 140 having a lower load than the pixel PXL shows a clean waveform as compared with the signal of the Nth stage output terminal Gout[n]. That is, since the Nth stage carry terminal CRY[n] is not connected to the pixel PXL, it has a shorter RC delay than the Nth stage output terminal Gout[n]. Thus, a signal of the Nth stage carry terminal CRY[n] is faster in time for rising edge or falling edge. Therefore, a transistor connected to the Nth stage carry terminal CRY[n] can be turned on or turned off quickly. Accordingly, the shift register 140 including a carry terminal can operate more effectively.

Referring to FIG. 9, the Nth stage of the shift register 140 includes the Nth stage output terminal Gout [n] and the Nth stage carry terminal CRY[n]. Also, the Nth stage of the shift register 140 includes a first transistor T1, a second transistor T2, a third transistor T3, a fourth transistor T4, a fifth transistor T5, a sixth transistor T6, a seventh transistor T7, an eighth transistor T8, a ninth transistor T9, and a capacitor.

The first transistor T1 charges the Q node Q in response to a potential of an N−rth stage carry output terminal CRY[n−r] (r is an integer of 1 or more). In the following description, for convenience in explanation, the first transistor T1 will be described as following a potential of a virtual N−2th stage carry output terminal CRY[n−2] rather than the start signal VST. However, for reference, the first transistor T1 may directly receive the start signal VST or may be supplied with a signal corresponding to the start signal VST from a previous or second previous stage carry output terminal depending on a position of a stage. A gate electrode and a drain electrode of the first transistor T1 are connected to the N−rth stage carry output terminal CRY[n−2] and a source electrode of the first transistor T1 is connected to the Q node Q.

The second transistor T2 discharges the Q node Q to the second low voltage terminal VSS in response to a potential of an N+sth stage carry output terminal CRY[n+s] (s is an integer of 1 or more). In the following description, for convenience in explanation, the second transistor T2 will be described as following a potential of an N+2th stage carry output terminal CRY[n+2]. However, for reference, the second transistor T2 may follow a potential of a subsequent or third subsequent stage carry output terminal depending on a position of a stage. The second transistor T2 is turned on after the bootstrap period BS of the Q node Q is ended so as to discharge the Q node Q to the second low voltage terminal VSS. In the second transistor T2, a gate electrode is connected to the N+2th stage carry output terminal CRY[n+2], a source electrode is connected to the second low voltage terminal VSS, and a drain electrode is connected to the Q node Q.

The third transistor T3 charges or discharges the Q node Q in response to a potential of an N−tth clock signal terminal CLK[n−t] (t is an integer of 1 or more). In the following description, for convenience in explanation, an N−tth clock signal will be defined as a fourth clock signal and an N−tth stage carry output terminal CRY [n−t] will be described as an N−1th stage carry output terminal CRY [n−1]. However, for reference, the second clock signal or the third clock signal may be connected to a gate electrode of the third transistor T3 depending on a position of a stage. Also, for reference, a second stage carry output terminal CRY[2] or a third stage carry output terminal CRY[3] may be connected to a drain electrode of the third transistor T3 depending on a position of a stage. In the third transistor T3, the gate electrode is connected to the N−tth clock signal terminal CLK[n−1], a source electrode is connected to the Q node Q, and the drain electrode is connected to the N−tth stage carry output terminal CRY[n−1].

The second transistor T2 and the third transistor T3 function to discharge the Q node Q, but are different from each other in number of times of discharging the Q node Q during a frame of the display panel 100. The second transistor T2 is turned on one time during a frame so as to discharge the Q node Q one time, whereas the third transistor T3 is turned on several times during a frame so as to discharge the Q node Q several times.

A transistor may have a double transistor structure in which two transistors having a gate electrode in common are connected in series to each other, so that a length of a channel layer through which charges are transfered can be longer than a typical transistor. The double transistor structure is resistant to leakage current and Ion degradation. Also, a transistor may have a triple transistor structure in which three transistors having a gate electrode in common are connected in series to each other, so that a length of a channel layer through which charges are transfered can be longer than the double transistor structure. The triple transistor structure is more resistant to leakage current and Ion degradation than the double transistor structure.

However, the triple transistor structure occupies a greater area than the double transistor structure and thus makes it difficult to manufacture the display panel 100 to have a small thickness. Accordingly, the inventors of the present disclosure invented a structure capable of improving Ion degradation using the double transistor structure. The shift register 140 employing the double transistor structure is greatly reduced in size as compared with the shift register 140 employing the triple transistor structure and thus makes it possible to manufacture the display device 100 to have a narrow bezel and a small thickness.

The first transistor T1, the second transistor T2, and the third transistor T3 illustrated in FIG. 9 have the double transistor structure, but are not necessarily limited thereto. At least one of the first transistor T1, the second transistor T2, and the third transistor T3 may have the double transistor structure.

In the double transistor structure of the first transistor T1, two transistors having a gate electrode in common and connected in series to each other may be connected to each other with the common node Nc interposed therebetween. Likewise, in the double transistor structure of the second transistor T2 and the third transistor T3, two transistors having a gate electrode in common and connected in series to each other may be connected to each other with the common node Nc interposed therebetween.

The fourth transistor T4 outputs a clock signal of the Nth clock signal terminal CLK[n] to the Nth stage output terminal Gout[n] in response to a potential of the Q node Q. Further, the sixth transistor T6 outputs a clock signal of the Nth clock signal terminal CLK[n] to the Nth stage carry output terminal CRY[n] in response to the potential of the Q node Q. In the following description, for convenience in explanation, the clock signal of the Nth clock signal terminal CLK[n] will be defined as a first clock signal. However, for reference, another signal (e.g., second clock signal, third clock signal, etc.) may be selected and input as the Nth clock signal depending on a position of a stage. In the fourth transistor T4, a gate electrode is connected to the Q node Q, a source electrode is connected to the Nth stage output terminal Gout[n], and a drain electrode is connected to the Nth clock signal terminal CLK[n]. Further, in the sixth transistor T6, a gate electrode is connected to the Q node Q, a source electrode is connected to the Nth stage carry output terminal CRY[n], and a drain electrode is connected to the Nth clock signal terminal CLK[n].

The Nth stage output terminal Gout[n] is connected to each pixel PXL in the display area 100A of the display panel 100, and the Nth stage carry output terminal CRY[n] is connected to the the shift register 140 without connection to the pixel PXL.

The fifth transistor T5 discharges a potential of the Nth stage output terminal Gout [n] to the first low voltage terminal VGL in response to a potential of an N+m clock signal terminal CLK[n+m]. Further, the seventh transistor T7 discharges a potential of the Nth stage carry output terminal CRY[n] to the second low voltage terminal VSS in response to the potential of the N+m clock signal terminal CLK[n+m]. In the following description, for convenience in explanation, a clock signal of the N+m clock signal terminal CLK[n+m] will be defined as a third clock signal. However, for reference, another signal (e.g., second clock signal, fourth clock signal, etc.) may be selected and input as the N+mth clock signal depending on a position of a stage.

In the fifth transistor T5, a gate electrode is connected to the N+m clock signal terminal CLK[n+2], a source electrode is connected to the first low voltage terminal VGL, and a drain electrode is connected to the Nth stage output terminal Gout[n]. Further, in the seventh transistor T7, a gate electrode is connected to the N+m clock signal terminal CLK[n+2], a source electrode is connected to the second low voltage terminal VSS, and a drain electrode is connected to the Nth stage carry output terminal CRY[n].

The capacitor C bootstraps the Q node Q of the Nth stage. One electrode of the capacitor C is connected to the Q node Q and the gate electrode of the pull-up transistor Tpu and the another electrode of the capacitor C is connected to the Nth stage output terminal Gout[n].

The Q node Q illustrated in FIG. 2 and FIG. 3 has a value ranging from a lowest first potential $V_1$ to a highest third potential $V_3$. The Q node Q illustrated in FIG. 9 has a value ranging from a lowest 0(zero)th potential $V_0$ to a highest third potential $V_3$. The 0(zero)th potential $V_0$ refer to a potential of the second low voltage terminal VSS and the first potential $V_1$ refer to a potential of the first low voltage terminal VGL.

Referring to FIG. 9 and FIG. 10, the Nth clock signal is maintained at a logic low level during the pre-charging period PC of the Q node Q. Therefore, even if the fourth transistor T4 and the sixth transistor T6 are turned on, the Nth stage output terminal Gout[n] and the Nth stage carry output terminal CRY[n] output a logic low signal VGL. Herein, the Nth stage output terminal Gout [n] outputs a signal having the first potential $V_1$ of the first low voltage terminal VGL through the fifth transistor T5. Also, the Nth stage carry output terminal CRY[n] outputs a signal having the 0(zero)th potential $V_0$ of the second low voltage terminal VSS through the seventh transistor T7.

Meanwhile, during the bootstrap period BS of the Q node Q, the Nth clock signal is maintained at a logic high level. Therefore, the fourth transistor T4 and the sixth transistor T6 are turned on and the Nth stage output terminal Gout[n] and the Nth stage carry output terminal CRY[n] output a logic high signal VGH.

The Nth stage of the shift register 140 includes the eighth transistor T8. The eighth transistor T8 refers to a junction stress control circuit that controls junction stresses for the first transistor T1, the second transistor T2, and the third transistor T3. The eighth transistor T8 charges the common node Nc in response to a potential of the Nth stage carry output terminal CRY[n]. During the bootstrap period BS of the Q node Q, a potential of the Nth stage carry output terminal CRY[n] has a logic high level, and the eighth transistor T8 applies the second potential $V_2$ to the common node Nc. In the eighth transistor T8, a gate electrode and a drain electrode are connected to the Nth stage carry output terminal CRY[n] and a source electrode is connected to the Q node Q.

The shift register 140 may further include the ninth transistor T9. The ninth transistor T9 refers to a junction stress control circuit with the eighth transistor T8. The ninth transistor T9 discharges the common node Nc to the second low voltage terminal VSS in response to a potential of the N+sth stage carry output terminal CRY[n+2]. When the bootstrap period BS of the Q node Q is ended, the ninth transistor T9 is applied with a logic high signal of the N+sth stage carry output terminal CRY[n+2] and thus turned on, and a potential of the common node Nc is discharged to the second low voltage terminal VSS. In the ninth transistor T9, a gate electrode is connected to the N+sth stage carry output terminal CRY[n+2], a source electrode is connected to the second low voltage terminal VSS, and a drain electrode is connected to the common node Nc.

During the bootstrap period BS, the Q node Q is increased to the third potential level $V_3$ and the N−rth stage carry output terminal CRY[n−2] has the 0(zero)th potential level $V_0$. Therefore, there occurs a big difference of voltage between the source electrode and the drain electrode of the first transistor T1. The difference of voltage serves as a junction stress for the first transistor T1, so that Ion degradation may occur.

During the bootstrap period BS, while the Q node Q is maintained at the third potential $V_3$, the eighth transistor T8 allows the common node Nc to be maintained at the second potential level $V_2$ of the Nth stage carry output terminal CRY[n]. Accordingly, in the first transistor T1, the second transistor T2, and the third transistor T3 connected to the common node Nc, a drain-source voltage Vds becomes equal to a peak voltage Vpp which is a difference between the third potential $V_3$ and the second potential $V_2$. Therefore, when all of the transistors included in the shift register 140 are turned off, a drain-source voltage Vds becomes equal to the peak voltage Vpp. Accordingly, it is possible to reduce that a specific transistor is degraded faster than the other transistors.

Figure 11A:
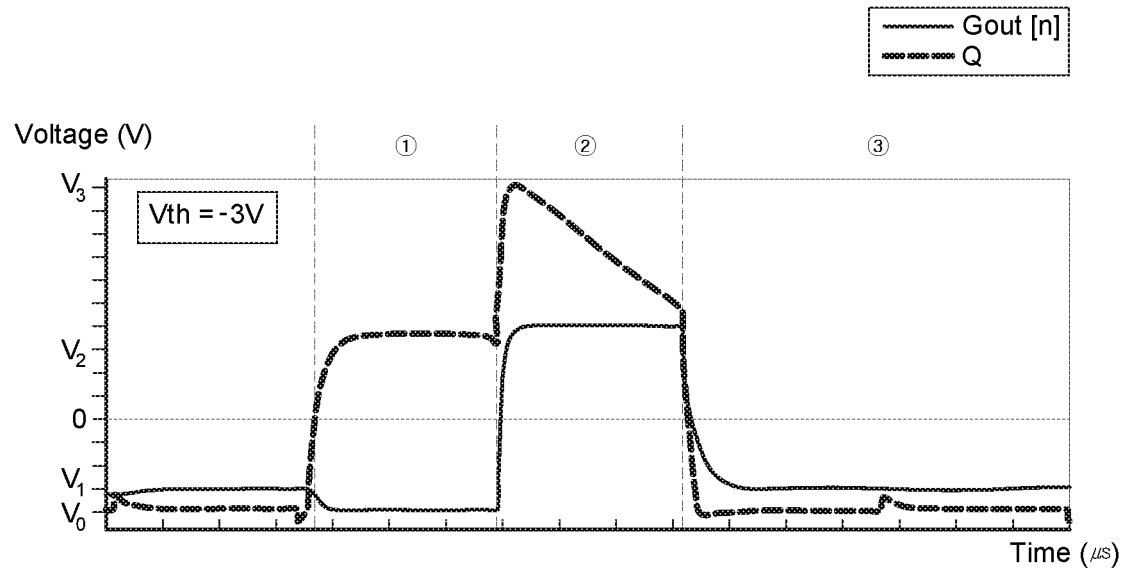
FIG. 11A is a graph showing waveforms according to Comparative Example.
Figure 11B:
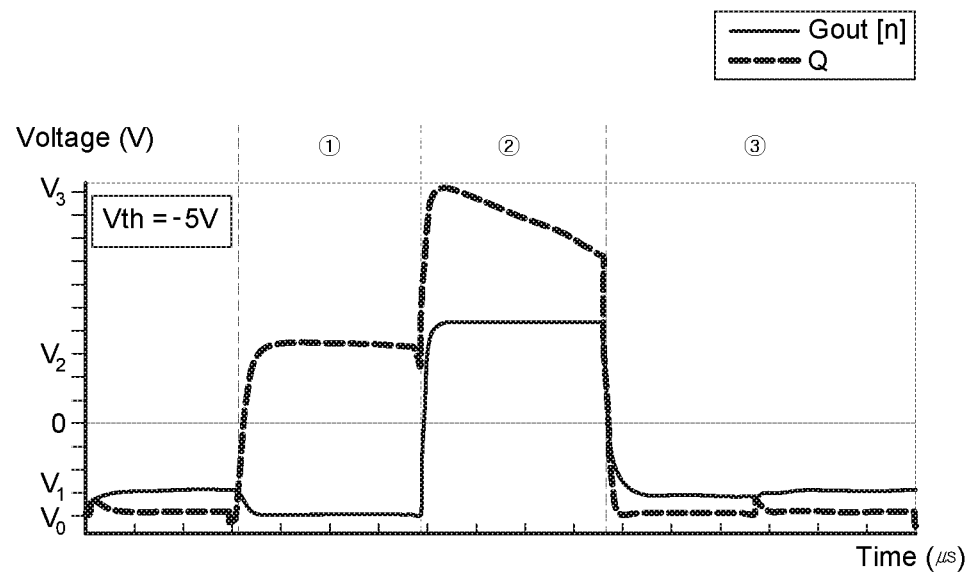
FIG. 11B is a graph showing waveforms of the circuit illustrated in FIG. 9.

FIG. 11A is a graph showing waveforms according to the Comparative Example, and FIG. 11B is a graph showing waveforms according to the exemplary embodiment illustrated in FIG. 9.

In the first transistor T1, the second transistor T2, or the third transistor T3 illustrated in FIG. 9, there may be a change in threshold voltage Vth while the transistor is formed. Further, while the bootstrap period BS of the Q node Q is overlapped with turn-off periods of the first to third transistors T1, T2, and T3, some of charges of the Q node Q may leak through the first to third transistors T1, T2, and T3. Particularly, as a change in threshold voltage Vth of the first to third transistors T1, T2, and T3 is increased, the amount of charges to be discharged may be increased. Referring to FIG. 11A and FIG. 11B, it can be seen that a waveform of the Q node Q charged to the third potential $V_3$ in the second period ② is decreased toward the second potential $V_2$.

As the amount of charges to be discharged during the bootstrap period BS is increased, a gate voltage of the fourth transistor T4 or the sixth transistor T6 illustrated in FIG. 9 is decreased. Therefore, the fourth transistor T4 may not sufficiently charge the Nth stage output terminal Gout[n].

Also, the sixth transistor T6 may not sufficiently charge the Nth stage carry output terminal CRY[n]. However, during the bootstrap period BS, the eighth transistor T8 charges the common node Nc. Therefore, charges of Q node Q, discharged through the common node Nc, can be compensated by the eighth transistor T8.

FIG. 11A is a waveform diagram of the Comparative Example in which the threshold voltage Vth of the first transistor T1 is changed by −3 V, and FIG. 11B is a waveform diagram of an example in which the threshold voltage Vth of the first transistor T1 in the shift register 140 illustrated in FIG. 9 is changed by −5 V. The threshold voltage Vth in FIG. 11B is more changed than the threshold voltage Vth in FIG. 11A. Therefore, the Q node Q of the shift register 140 corresponding to FIG. 11B may be more discharged than the Q node Q of the shift register 140 corresponding to FIG. 11A. However, in the exemplary embodiment illustrated in FIG. 11B, the eighth transistor T8 compensates for charges discharged from the Q node Q. Therefore, during the bootstrap period BS, the Q node Q has a higher potential in FIG. 11B than in FIG. 11A. Accordingly, it is possible to stably maintain an output of the shift register 140. The same effect can be seen in the other exemplary embodiments such as the shift register 140 illustrated in FIG. 2 and FIG. 3.

When the bootstrap period BS is ended, the fifth transistor T5 is turned on so as to start discharge of the Nth stage output terminal Gout[n]. Meanwhile, the Nth stage output terminal Gout [n] may also be discharged temporarily by the fourth transistor T4. Meanwhile, the Q node Q is the gate electrode of the fourth transistor T4. Therefore, if a voltage of the Q node Q when the bootstrap period BS is ended is large, a gate-source voltage Vgs of the fourth transistor T4 may be large. Therefore, the fourth transistor T4 can more discharge the Nth stage output terminal Gout[n].

According to the waveform in FIG. 11B, a voltage of the Q node Q when the bootstrap period BS is ended is relatively high. Also, it can be seen that a falling edge of a voltage of the Nth stage output terminal Gout[n] has a steep slope as compared with FIG. 11A. Therefore, an overlapped period with respect to an output of a subsequent stage can be reduced, so that output characteristics of the shift register 140 can be improved. This effect is not limited to the shift register 140 illustrated in FIG. 9, but the same effect can be obtained from the other exemplary embodiments such as the shift register 140 illustrated in FIG. 2 or FIG. 3.

The shift register 140 employing a multi-level low voltage terminal may have the following characteristics.

Referring to FIG. 9 and FIG. 10, during the third period ③, the Q node Q is maintained at the 0 (zero) th potential $V_0$ of the second low voltage terminal VSS, which is lower than the first potential $V_1$ of the Nth stage output terminal Gout[n]. Therefore, if the fourth transistor T4 illustrated in FIG. 9 is turned off, there occurs a period in which a gate-source voltage Vgs of the fourth transistor T4 is lower than 0. Accordingly, a negative shift may occur in the fourth transistor T4, and the negative shift may allow the fourth transistor T4 to be compensated as much as a positive shift is proceeded.

Meanwhile, during the third period ③, the Q node Q illustrated in FIG. 9 is maintained at a lower potential than the Q node Q illustrated in FIG. 2 or FIG. 3. Therefore, during the bootstrap period BS, a drain-source voltage Vds of the first transistor T1 illustrated in FIG. 9 may be higher than a drain-source voltage Vds of the first transistor T1 illustrated in FIG. 2 or FIG. 3. Accordingly, the first transistor T1 illustrated in FIG. 9 employing a multi-level low voltage terminal is applied with a higher junction stress, Ion degradation may proceed more rapidly. Therefore, in the shift register 140 employing a multi-level low voltage terminal, compensation for degradation can be conducted more effectively by the junction stress control circuit of the present disclosure.

Also, the shift register 140 employing a multi-level low voltage terminal has a higher peak voltage Vpp of the Q node Q than the shift register 140 employing a single-level low voltage terminal. Therefore, the transistor connected to the Q node Q has a higher gate-source voltage Vgs, so that the operation characteristics can be improved.

The exemplary embodiments of the present disclosure can also be described as follows:

According to an aspect of the present disclosure, a gate driving circuit includes a plurality of stages. An Nth stage (N is a positive integer) of the plurality of stages includes a first transistor charging a Q node and a junction stress control circuit connected to the first transistor through a common node. The junction stress control circuit may be configured to control a voltage of the common node in order to minimize a junction stress for the first transistor.

The junction stress control circuit may be configured to adjust a drain-source voltage of the first transistor in order to minimize degradation of the first transistor.

The junction stress control circuit may include a first control transistor and a second control transistor, and the first control transistor, the second control transistor, and the first transistor may be connected to each other through the common node.

The second control transistor may be configured to control a first junction stress and a second junction stress. The first junction stress is generated by a voltage difference between a drain electrode and a source electrode of the first transistor, and the second junction stress is generated by a voltage difference between a drain electrode and a source electrode of the first control transistor.

A first potential $V_1$ is applied to the Q node during a first time period, a second potential $V_2$ higher than the first potential $V_1$ is applied to the Q node during a second time period, and, a third potential $V_3$ higher than the second potential $V_2$ is applied to the Q node during a bootstrap period. The second control transistor may be configured to control a voltage of the common node such that a ratio of the second junction stress to the first junction stress during the bootstrap period is controlled in the range of 1:0.9 to 1:1.

A gate electrode of the first transistor and a gate electrode of the first control transistor may be connected to an N−jth stage output terminal (N and j are an integer of 1 or more).

The junction stress control circuit may further include a third control transistor that discharges the common node.

The first transistor, the first control transistor, the second control transistor, and the third control transistor may be configured as NMOS transistors.

At least one of the first control transistor and the second control transistor may have a gate electrode and a drain electrode connected to each other.

According to another aspect of the present disclosure, a display device includes a display area having a plurality of pixels , a non-display area adjacent to the display area, and a circuit unit disposed on the non-display area and corresponding to the plurality of pixels. The circuit unit includes a first transistor and a junction stress control circuit. The first transistor charges a Q node and the first transistor is connected to the junction stress control circuit through a common node. The junction stress control circuit controls a drain-source voltage Vds of the first transistor. Thus, degradation characteristics of the first transistor can be improved as compared with a circuit without the junction stress control circuit.

The junction stress control circuit may include a first control transistor and a second control transistor connected to the first control transistor. The second control transistor may be configured to control a drain-source voltage of the first control transistor or the drain-source voltage of the first transistor by charging the common node to a first voltage.

The second control transistor may be configured to apply a voltage lower than a voltage applied to the Q node to the common node in a turn-off period of the first transistor and the first control transistor.

The junction stress control circuit may further include a third control transistor connected to the common node. The third control transistor may be configured to discharge the common node in a turn-off period of the second control transistor.

According to a yet another aspect of the present disclosure, a gate driver includes a pull-up circuit configured to output an output signal to be applied to a pixel circuit that drives pixels of a display device, a first transistor configured to control the pull-up circuit, and a control circuit connected to the first transistor so as to minimize degradation of the first transistor and compensate for a current leaking through the first transistor.

The first transistor may include an oxide semiconductor layer.

The pull-up circuit may include a first pull-up transistor configured to apply a first output signal to a first output signal terminal and a second pull-up transistor configured to apply a second output signal to a second output signal terminal.

The first output signal terminal may be connected to the pixel circuit, and the second output signal terminal may not be connected to the pixel circuit.

A low level of the first output signal may be higher than a low level of the second output signal.

The control circuit may be configured to apply the first output signal or the second output signal to the first transistor during a period in which the first output signal and the second output signal maintain a high level.

It will be apparent to those skilled in the art that various modifications and variations can be made in the gate driving circuit and display device using the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A gate driving circuit having a plurality of stages, comprising:
    an Nth stage (N is a positive integer) of the plurality of stages including a first transistor that charges a Q node, a second transistor that periodically discharges the Q node, and a junction stress control circuit connected to the first transistor through a common node,
    wherein the junction stress control circuit includes a first control transistor and is configured to control a voltage of the common node in order to minimize a junction stress for the first transistor, and
    wherein the voltage of the common node is applied in order for a ratio of a drain-source voltage of the first transistor and a drain-source voltage of the first control transistor to be in the range of 1:0.9 to 1:1, while the Q node is bootstrapped,
    wherein the junction stress control circuit further includes a second control transistor, and the second control transistor and the first transistor are connected to each other through the common node, and
    wherein each of the first control transistor and the second control transistor has a gate electrode and a drain electrode connected to each other.

2. The gate driving circuit according to claim 1, wherein the junction stress control circuit is configured to adjust the drain-source voltage of the first transistor in order to minimize degradation of the first transistor.

3. The gate driving circuit according to claim 1, wherein the second control transistor is configured to control a first junction stress and a second junction stress, the first junction stress is generated by a voltage difference between a drain electrode and a source electrode of the first transistor, and the second junction stress is generated by a voltage difference between a drain electrode and a source electrode of the first control transistor.

4. The gate driving circuit according to claim 3, wherein a first potential is applied to the Q node during a first time period, a second potential higher than the first potential is applied to the Q node during a second time period, and a third potential higher than the second potential is applied to the Q node during a bootstrap period.

5. The gate driving circuit according to claim 1, wherein a gate electrode of the first transistor and a gate electrode of the first control transistor are connected to an N-jth stage output terminal (N and j are an integer of 1 or more).

6. The gate driving circuit according to claim 1, wherein the junction stress control circuit further includes a third control transistor that discharges the common node.

7. The gate driving circuit according to claim 6, wherein the first transistor, the first control transistor, the second control transistor, and the third control transistor are configured as NMOS transistors.

8. A display device, comprising:
    a display area having a plurality of pixels;
    a non-display area adjacent to the display area; and
    a circuit unit disposed on the non-display area and corresponding to the plurality of pixels,
    wherein the circuit unit includes a first transistor having a double transistor structure, a second transistor having a double transistor structure, a third transistor having a double transistor structure, and a junction stress control circuit,
    wherein the first transistor charges a Q node, and the first transistor is connected to the junction stress control circuit through a common node,
    wherein the first transistor, the second transistor, and the third transistor are connected to the junction stress control circuit through the common node,
    wherein the junction stress control circuit controls a drain-source voltage of the first transistor to improve degradation characteristics of the first transistor compared to a circuit without the junction stress control circuit,
    wherein the common node is connected each between two transistors of the first transistor, between two transistors of the second transistor, and between two transistors of the third transistor,
    wherein the junction stress control circuit includes a first control transistor and a second control transistor connected to the first control transistor, and
    wherein the second control transistor is configured to control a drain-source voltage of the first control transistor or the drain-source voltage of the first transistor by charging the common node to a first voltage.

9. The display device according to claim 8, wherein the second control transistor is configured to apply a voltage lower than a voltage applied to the Q node to the common node in a turn-off period of the first transistor and the first control transistor.

10. The display device according to claim 8, wherein the second transistor and the third transistor are configured to discharge the Q node.

* * * * *